(12) United States Patent
Hofmeister et al.

(10) Patent No.: US 8,267,636 B2
(45) Date of Patent: Sep. 18, 2012

(54) SUBSTRATE TRANSPORT APPARATUS

(75) Inventors: Christopher Hofmeister, Hampstead, NH (US); Robert T. Caveney, Windham, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 714 days.

(21) Appl. No.: 12/117,355

(22) Filed: May 8, 2008

(65) Prior Publication Data
US 2008/0298944 A1 Dec. 4, 2008

Related U.S. Application Data

(60) Provisional application No. 60/916,724, filed on May 8, 2007.

(51) Int. Cl.
*B25J 18/00* (2006.01)

(52) U.S. Cl. ............... 414/744.5; 74/490.01; 74/490.03; 901/15; 901/23

(58) Field of Classification Search ............... 414/744.5, 414/744.3; 901/15, 23; 74/490.01, 490.03
See application file for complete search history.

(56) References Cited

U.S. PATENT DOCUMENTS

| | | | |
|---|---|---|---|
| 4,144,110 A | 3/1979 | Luc | 156/73.5 |
| 4,609,332 A | 9/1986 | Miki et al. | 417/352 |
| 4,689,945 A | 9/1987 | Lattion et al. | 57/263 |
| 4,702,668 A * | 10/1987 | Carlisle et al. | 414/744.5 |
| 4,874,998 A | 10/1989 | Hollis, Jr. | 318/568.21 |
| 4,956,945 A | 9/1990 | Ooshima | 51/165.93 |
| 5,092,453 A | 3/1992 | Bruke | 198/673 |
| 5,126,610 A | 6/1992 | Fremerey | 310/90.5 |
| 5,324,155 A | 6/1994 | Goodwin et al. | 414/225 |
| 5,530,306 A | 6/1996 | Ueyama | 310/90.5 |
| 5,535,582 A | 7/1996 | Paweletz | 57/414 |
| 5,550,413 A | 8/1996 | Bernus et al. | 310/36 |
| 5,555,715 A | 9/1996 | Paweletz et al. | 57/414 |
| 5,625,240 A | 4/1997 | Bernus | 310/90.5 |
| 5,642,298 A | 6/1997 | Mallory et al. | 364/561 |
| 5,741,113 A | 4/1998 | Bacchi et al. | 414/744.5 |
| 5,801,721 A | 9/1998 | Gandy et al. | 347/3 |
| 5,818,137 A | 10/1998 | Nichols et al. | 310/90.5 |
| 5,838,121 A | 11/1998 | Fairbairn et al. | 318/45 |
| 5,899,658 A | 5/1999 | Hofmeister | 414/744.5 |
| 5,914,548 A | 6/1999 | Wantanabe et al. | 310/88 |
| 5,961,291 A | 10/1999 | Sakagami et al. | 417/42 |
| 6,015,272 A | 1/2000 | Antaki et al. | 417/356 |

(Continued)

FOREIGN PATENT DOCUMENTS
EP 129731 1/1985
(Continued)

*Primary Examiner* — Donald Underwood
(74) *Attorney, Agent, or Firm* — Perman & Green, LLP; Colin C. Durham

(57) ABSTRACT

A substrate transport apparatus including a first shaftless rotary motor including a first stator and a first rotor, the first stator being linearly distributed and the first rotor being coupled to a first arm, a second shaftless rotary motor including a second stator and second rotor, the second stator being linearly distributed and the second rotor being coupled to a second arm, the second arm being connected to the first arm and a first substrate support being coupled to at least one of the first and second arms, wherein the first stator and second stator are configured so that the first and second arms and the first substrate support are inside the stators and a motor output at a connection between the first and second shaftless rotary motors and a respective one of the first and second arms is a resultant force disposed peripheral to the first and second arms.

17 Claims, 14 Drawing Sheets

U.S. PATENT DOCUMENTS

| | | | |
|---|---|---|---|
| 6,049,148 A | 4/2000 | Nichols et al. | 310/68 |
| 6,086,362 A | 7/2000 | White et al. | 432/243 |
| 6,096,231 A | 8/2000 | Schertler | 216/41 |
| 6,100,618 A | 8/2000 | Schoeb et al. | 310/90.5 |
| 6,175,174 B1 | 1/2001 | Takahashi | 310/90.5 |
| 6,176,668 B1 | 1/2001 | Kurita et al. | 414/217 |
| 6,189,404 B1 | 2/2001 | Hatake et al. | 74/490.03 |
| 6,206,176 B1 | 3/2001 | Blonigan et al. | 198/619 |
| 6,227,817 B1 | 5/2001 | Paden | 417/356 |
| 6,235,172 B1 | 5/2001 | Begin et al. | 204/298.27 |
| 6,244,835 B1 | 6/2001 | Antaki et al. | 417/356 |
| 6,269,552 B1 | 8/2001 | Honda et al. | 34/317 |
| 6,299,404 B1 | 10/2001 | Muka et al. | 414/744.5 |
| 6,324,134 B1 | 11/2001 | Ohtachi et al. | 369/44.32 |
| 6,384,500 B1 | 5/2002 | Chassoulier et al. | 310/90.5 |
| 6,416,215 B1 | 7/2002 | Terentiev | 366/273 |
| 6,447,265 B1 | 9/2002 | Antaki et al. | 417/354 |
| 6,447,266 B2 | 9/2002 | Antaki et al. | 417/356 |
| 6,471,459 B2 | 10/2002 | Blonigan et al. | 414/217 |
| 6,485,531 B1 | 11/2002 | Schob | 29/25.01 |
| 6,537,011 B1 | 3/2003 | Wang et al. | 414/217 |
| 6,573,088 B2 | 6/2003 | Gemmell et al. | 435/286.4 |
| 6,809,450 B1 | 10/2004 | Morrison | 310/90.5 |
| 6,813,543 B2 | 11/2004 | Aalund et al. | 700/245 |
| 6,864,955 B2 | 3/2005 | Nishi et al. | 355/53 |
| 6,877,963 B2 | 4/2005 | Beyer et al. | 417/353 |
| 6,878,044 B2 | 4/2005 | Sakurai et al. | 451/67 |
| 6,991,710 B2 | 1/2006 | Harris et al. | 204/198 |
| 7,023,118 B1 | 4/2006 | Morrison | 310/90.5 |
| 7,053,582 B2 | 5/2006 | Ueyama et al. | 318/632 |
| 7,070,398 B2 | 7/2006 | Olsen et al. | 417/353 |
| 7,087,143 B1 | 8/2006 | Schmidt et al. | 204/224 R |
| RE39,748 E | 7/2007 | Wantanabe et al. | 310/88 |
| 7,246,985 B2 | 7/2007 | Ferrara | 414/217 |
| 7,371,306 B2 | 5/2008 | Davis et al. | 156/345.22 |
| 2002/0070617 A1 | 6/2002 | Kanebako | 310/90.5 |
| 2003/0102748 A1 | 6/2003 | Yashiro et al. | 310/90.5 |
| 2005/0002743 A1 | 1/2005 | Moriya et al. | 406/198 |
| 2005/0089422 A1 | 4/2005 | Ozaki et al. | 417/423.12 |
| 2005/0135942 A1 | 6/2005 | Wood et al. | 417/348 |
| 2005/0136694 A1 | 6/2005 | Inoue et al. | 438/795 |
| 2005/0188798 A1 | 9/2005 | Bischof et al. | 84/1.11 |
| 2005/0265814 A1 | 12/2005 | Coady | 414/744.5 |
| 2006/0017340 A1 | 1/2006 | Kozaki et al. | 310/90.5 |
| 2006/0219275 A1 | 10/2006 | Weber et al. | 134/64 R |
| 2006/0275155 A1 | 12/2006 | Thibodeau | 417/410.1 |
| 2006/0279149 A1 | 12/2006 | Asper | 310/90.5 |
| 2007/0024138 A1 | 2/2007 | Buhler et al. | 310/90.5 |
| 2007/0269986 A1 | 11/2007 | Kalenian et al. | 438/692 |
| 2008/0011334 A1 | 1/2008 | Rye et al. | 134/95.1 |
| 2008/0121064 A1 | 5/2008 | Tordorov | 74/490.04 |

FOREIGN PATENT DOCUMENTS

| | | |
|---|---|---|
| EP | 414127 | 2/1991 |
| EP | 526903 | 2/1993 |
| EP | 641061 | 3/1995 |
| EP | 758157 | 2/1997 |
| EP | 816701 | 1/1998 |
| EP | 1114648 | 7/2001 |
| EP | 1732011 | 12/2006 |
| GB | 1552874 | 9/1979 |
| GB | 2035622 | 6/1980 |
| JP | 61152304 | 7/1986 |
| JP | 1023468 | 1/1989 |
| JP | 1240268 | 9/1989 |
| JP | 3276317 | 12/1991 |
| JP | 4209996 | 7/1992 |
| JP | 4308823 | 10/1992 |
| JP | 6213233 | 8/1994 |
| JP | 7012091 | 1/1995 |
| JP | 8323505 | 12/1996 |
| JP | 10023781 | 1/1998 |
| WO | 8912907 | 12/1989 |
| WO | 9837335 | 8/1998 |
| WO | 0102721 | 1/2001 |
| WO | 0231372 | 4/2002 |
| WO | 2004098677 | 11/2004 |
| WO | 2005003565 | 1/2005 |
| WO | 2005030296 | 4/2005 |
| WO | 2006010285 | 2/2006 |
| WO | 2006053384 | 5/2006 |
| WO | 2008003943 | 4/2008 |

* cited by examiner

SUBSTRATE TRANSPORT APPARATUS

CROSS-REFERENCE TO RELATED APPLICATION(S)

This application claims the benefit of U.S. Provisional Patent Application No. 60/916,724, filed on May 8, 2007, and is related to U.S. Provisional Patent Application No. 60/916,781, filed on May 8, 2007, the disclosures of which are incorporated by reference herein in their entirety.

BACKGROUND

1. Field

The exemplary embodiments relate to a substrate transport apparatus and, more particularly, to a robot transport arm of a substrate transport apparatus.

2. Brief Description of Related Developments

Various types of substrate transport apparatus are known in the art. Examples of substrate transport apparatus are described in U.S. Pat. Nos. 5,404,894, 5,431,529 and 5,765,983. U.S. Pat. No. 4,951,601 discloses a substrate processing apparatus with multiple processing chambers and a substrate transport apparatus.

In many substrate processing applications, a substrate transport apparatus includes a substrate transport robot which is mounted in a central transfer chamber. Typically, the transport robot has a controller that controls a drive that powers an arm assembly. The arm assembly typically operates in the transfer chamber to transfer a substrate to and from various processing chambers on a substrate support or an end effector.

Generally, the transport and processing chambers are maintained substantially at a vacuum to prevent contamination of substrates while being transported and processed. Other atmospheres may also be maintained in the transport and processing chambers if required. Some processing techniques may require the use of atmospheres that are corrosive, have an elevated temperature, or that generally present a hostile environment to the transport robot electronics and drive. In these cases, it would be advantageous to locate the controller and drive outside the hostile environment of the transfer chamber. It would also be advantageous to simplify the mechanical coupling between the drive and the end effector. It would be still further advantageous to couple the drive to the end effector in a manner that does not require a mechanical connection through the wall of the transfer chamber.

SUMMARY

In accordance with one exemplary embodiment a substrate transport apparatus is provided. The substrate transport apparatus includes a first shaftless rotary motor including a first stator and a first rotor, the first stator being linearly distributed and the first rotor being coupled to a first arm, a second shaftless rotary motor including a second stator and a second rotor, the second stator being linearly distributed and the second rotor being coupled to a second arm, the second arm being connected to the first arm, and a first substrate support being coupled to at least one of the first and second arms, wherein the first stator and second stator are configured so that the first and second arms and the first substrate support are inside the stators and a motor output at a connection between the first and second shaftless rotary motors and a respective one of the first and second arms is a resultant force disposed peripheral to the first and second arms.

In accordance with another exemplary embodiment a substrate transport apparatus is provided. The substrate transport apparatus includes a first shaftless rotary motor including a first stator and a first rotor, the first stator being linearly distributed and the first rotor being coupled to a first arm, a second shaftless rotary motor including a second stator and a second rotor, the second stator being linearly distributed and the second rotor being coupled to a second arm, the second arm being connected to the first arm, and a first substrate support being coupled to at least one of the first and second arms, wherein the first stator and second stator are arranged so that the first stator and second stator substantially surround the first and second arms.

In accordance with yet another exemplary embodiment a substrate transport apparatus is provided. The substrate transport apparatus includes a housing, a first stator linearly distributed substantially along peripheral walls of the housing, a second stator linearly distributed substantially along the peripheral walls of the housing, a first substrate transport arm having a center of rotation located within the housing, the first substrate transport arm having an upper arm rotatable about the center of rotation and forming a first rotor, a forearm rotatably coupled at a first end to the upper arm at a location eccentric to the center of rotation, the forearm forming a second rotor, and a first substrate support rotatably coupled to a second opposite end of the forearm, and wherein the first stator and first rotor form a first motor and the second stator and second rotor form a second motor, and the upper arm, forearm and first substrate support are inside the first and second stators and a motor output of the first and second motors at a connection point between the first and second motors and a respective one of the upper arm and forearm is a resultant force disposed peripheral to the upper arm and forearm.

BRIEF DESCRIPTION OF THE DRAWINGS

The foregoing aspects and other features of the exemplary embodiments are explained in the following description, taken in connection with the accompanying drawings, wherein.

DETAILED DESCRIPTION OF THE EXEMPLARY EMBODIMENTS

Figure 1:
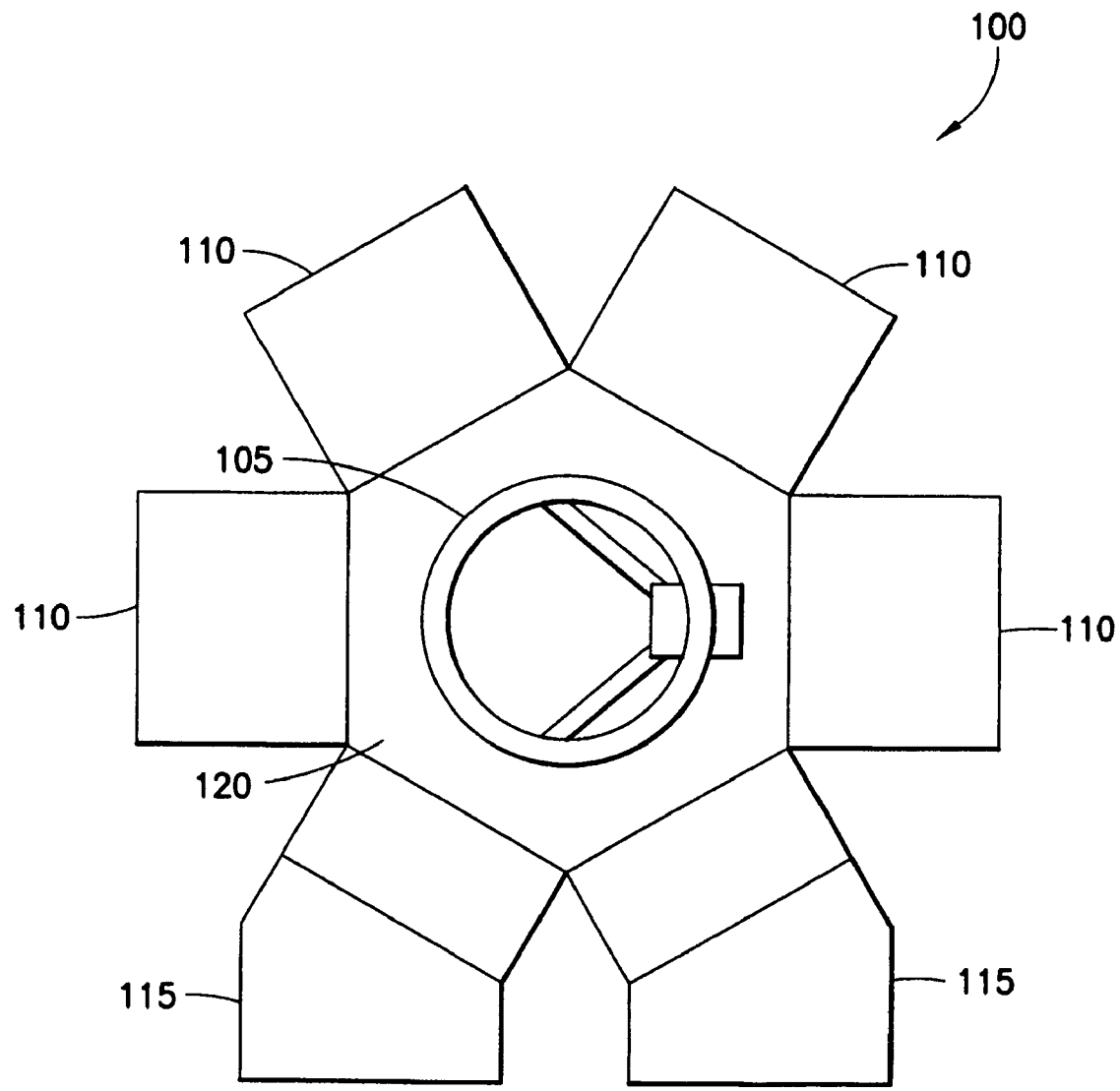
FIG. 1 shows a schematic top plan view of a substrate processing system incorporating features an exemplary embodiment.

Referring to FIG. 1, there is shown a schematic top plan view of a substrate processing system 100 incorporating features of the exemplary embodiments. Although the embodiments disclosed will be described with reference to the embodiments shown in the drawings, it should be understood that the embodiments disclosed can be embodied in many alternate forms. In addition, any suitable size, shape or type of elements or materials could be used.

As shown in FIG. 1, substrate processing system 100 includes a substrate transport apparatus 105, and may include multiple processing chambers 110, substrate cassette elevators or load locks 115 and a central transfer chamber 120. The substrate processing system 100 is shown in the Figures as a clustered processing system for exemplary purposes only. Substrate processing system 100 is merely an example of a substrate processing system and it should be understood that the exemplary embodiments apply equally well to any other suitable type of substrate processing system including, but not limited to, linear processing systems. Examples of suitable processing systems in which the exemplary embodiments can be incorporated include but are not limited to U.S. patent application Ser. No. 11/442,511, entitled "Linearly distributed Semiconductor Workpiece Processing Tool," filed May 26, 2006, the disclosure of which is incorporated by reference herein in its entirety. Substrate transport apparatus 105 may be located at least partially in transfer chamber 120. The apparatus 105 is adapted to move a substrate from, for example, one of the load locks 115 to, for example, a processing chamber 110 for processing. When processing chamber 110 is finished processing the substrate, substrate transport apparatus 105 may be used to move the substrate to another processing chamber 110, or to return the substrate to one of the load locks 115.

For purposes of the exemplary embodiments, a substrate may be a semiconductor wafer, a flat panel display, a glass panel, or any other substrate suitable for processing by substrate processing system 100.

A vacuum may be maintained in transfer chamber 120, however, it should be understood that transfer chamber 120 may contain any other desired atmosphere for processing substrates. For example, the atmospheres may include, but are not limited to, controlled air and inert gas atmospheres. Substrate processing system 100 may include appropriate systems and plumbing (not shown) for generating, and maintaining the desired atmosphere in transfer chamber 120. For example, a vacuum pump (not shown) may be connected to transfer chamber 120 using suitable plumbing to draw a desired vacuum condition in transfer chamber 120. The vacuum pump may be regulated by a controller using appropriate monitoring devices (not shown), such as pressure gauges. In alternate embodiments, substrate transport apparatus 105 may be located in a chamber open to outside atmosphere or include air pumps to pump controlled air or inert gases into the chamber.

Figure 2:
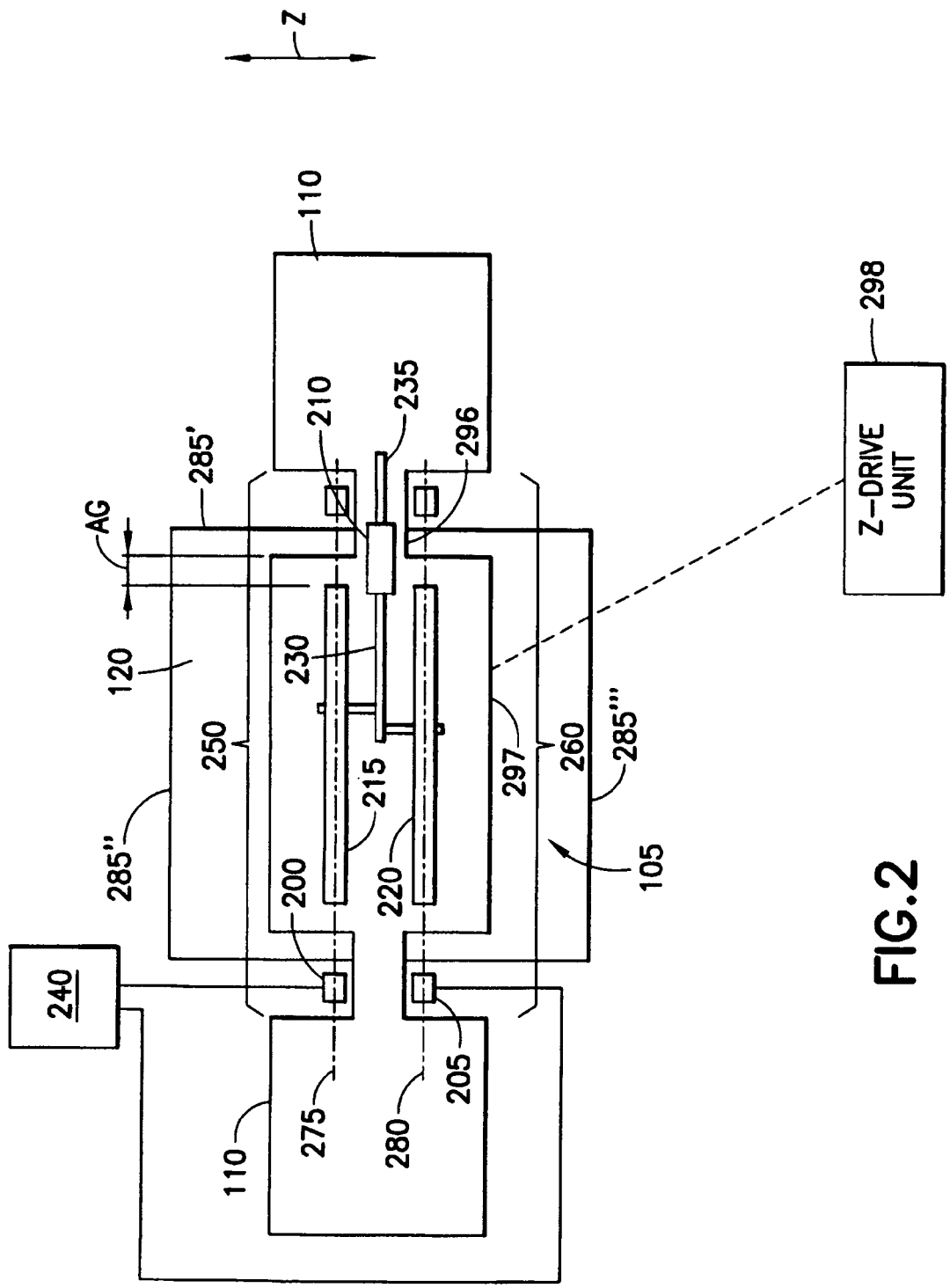
FIG. 2 shows a side view of a substrate transport apparatus in accordance with an exemplary embodiment.
Figure 3A:
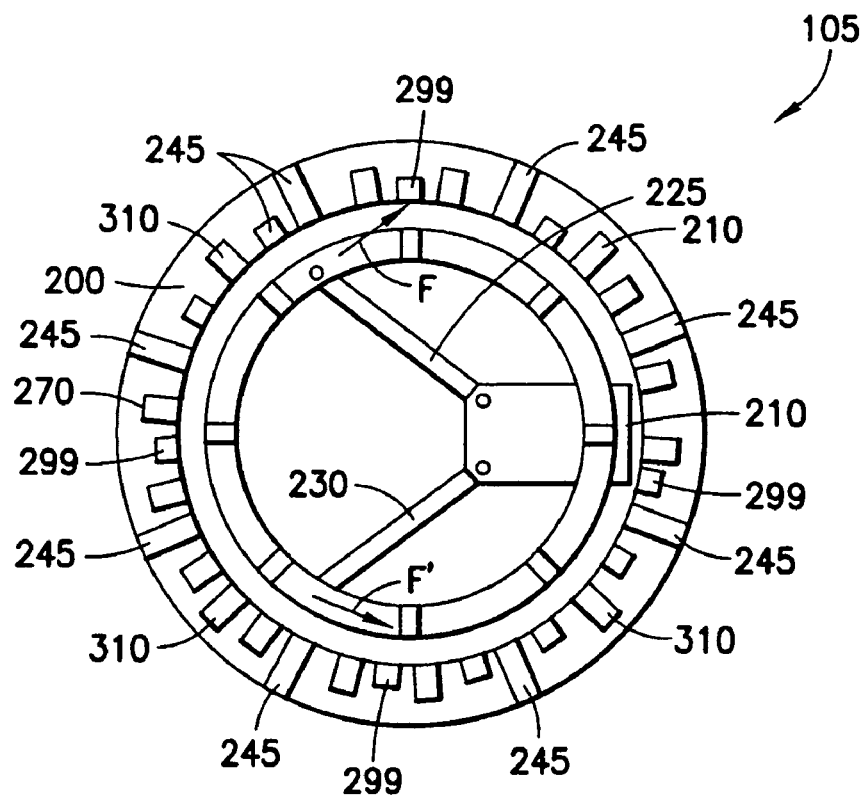
FIG. 3A shows a top view of the embodiment shown in FIG. 2.

FIG. 2 shows a side view and FIG. 3A shows a top view of one exemplary embodiment of substrate transport apparatus 105. It is noted that while the exemplary embodiments will be described with respect to certain transfer assemblies, it should be realized that the magnetic drive system described herein may be applied or adapted to any suitable transfer assembly and is not limited to use with the exemplary transfer assemblies shown in the Figures.

In this example, substrate transport apparatus 105 has a first winding set, also referred to as a first stator 200 and a second winding set, also referred to as a second stator 205, each electrically connected to a controller 240. The controller 240 may be any suitable controller including any suitable circuitry and/or program instructions for causing the operations of the substrate transport apparatus as described herein. In one embodiment the controller 240 may be part of a clustered architecture as described in U.S. patent application Ser. No. 11/178,615, the disclosure of which is incorporated herein by reference in its entirety. The first and second stators 200, 205 may have at least two primary windings 245 as can be seen in FIG. 3A. The stators 200, 205 may be configured to substantially follow any suitable contour of the transfer chamber housing 285. The contours may include the outside surface of the chamber walls, an inside surface of the chamber walls or an interior portion (e.g. inside or integral with) of the chamber walls. In the exemplary embodiments shown in FIG. 2, the stators 200, 205 are configured to substantially follow the contour of the side walls 285'. In other exemplary embodiments the stators 200, 205 may be configured to substantially follow a contour of the upper and lower walls 285", 285''' of the housing 285. In alternate embodiments the stators may be configured to follow the contour of any suitable structure inside or outside of the transfer chamber 120. For example, the stators may follow the contour of a stator support that can have any suitable configuration within or outside the transfer chamber 120.

It is noted that the stators 200, 205 may be similar to the stators described in U.S. Pat. Nos. 5,720,590; 5,813,823; and 5,899,658 all of which are incorporated herein by reference in their entirety. For example, each of the first and second stators 200, 205 may be affixed to the drive housing 285 and isolated from the internal atmosphere of the transfer chamber 120 (i.e. each drive housing has a portion which passes between its respective rotor and stator, and sufficient clearance is provided between the rotor and this part of the drive housing). In one example, magnetic fields that may be produced by the stators 200, 205 outside of the transfer chamber 120 impart rotary motion to the first and second rotors 215, 220 inside the transfer chamber 120. In other exemplary embodiments, as will be described below, the stators may be located at any suitable location with respect to the transfer chamber 120 for imparting rotary motion to the first and second rotors 215, 220. For example, the stators 200, 205 may be located substantially along a contour of a moveable housing 297, which will be described below.

In this example, substrate transport apparatus 105 also has a first rotor 215 and a second rotor 220. First and second rotors 215, 220 may be permanent magnet rotors, each having at least two poles. While rotors 215, 220 are shown in FIG. 3A as having a ring shape, it should be understood that rotors 215, 220 may have any other shape such as a disk, star, spoked wheel, or any shape suitable for use as a rotor.

Controller 240 may be operable to apply power to primary windings 245 in first and second stators 200, 205. First stator 200 and first rotor 215 operate together as a first motor 250, also referred to as a first drive section. The first stator 200 and the first rotor 215 may form a first shaftless rotary drive or motor in that there is no shaft applying torque to the rotor 215 or to an arm of the transfer assembly as will be described below. As can be seen in FIG. 3A the stator 200 and/or rotor 215 may be linearly distributed in for example, an arcuate manner. In alternate embodiments, the stator 200 and/or rotor 215 may be distributed in any suitable manner to follow any suitable predetermined linear, and/or curved rotor path. Second stator 205 and second rotor 220 operate together as a second motor 260, also referred to as a second drive section. The second stator 205 and the second rotor 220 may form a second shaftless rotary drive that is substantially similar to the shaftless rotary drive described above with respect to stator 200 and rotor 215. Motors 250, 260 may comprise magnetic bearings, that is, the forces exerted on each rotor 215, 220 by its respective stator 200, 205 may serve to support each rotor 215, 220 in position without a need for conventional bearings and/or support shafts. In alternate embodiments, motors 250, 260 may be any other suitable type, such as, for example, brushless DC motors, stepper motors, or conventional motors.

In this exemplary embodiment, first and second motors 250, 260 are shown stacked one over the other, in vertical alignment for exemplary purposes only. It should be understood that motors 250, 260 may be positioned co-axially with respect to each other, may be offset, side by side, may be positioned at an angle, or may have any other spatial orientation with respect to each other.

Regardless of the type of motor configuration, each stator 200, 205 produces a magnetic torque on the respective associated rotor 215, 220, which, if applied with enough force, causes the respective rotor 215, 220 to rotate. Controller 240 may be capable of applying power to stators 200, 205 such that rotors 215 and 220 rotate axially, either independently or synchronously. Controller 240 may also be capable of applying power independently to stator 200 to control the axial position of rotor 215, and may be capable of applying power independently to stator 205 to control the axial position of rotor 220. The stator 200, 205 and rotor 215, 220 combination may be substantially similar to a self-bearing motor in that a suitable air gap AG is maintained between the rotors 215, 220 and the chamber wall and/or stators 200, 205.

In addition, as can be seen in FIG. 3A, first and second stators 200, 205 may have a number of permanent magnets 270 dispersed around their circumferences. In this exemplary embodiment, permanent magnets 270 on first and second stators 200, 205 are positioned such that magnetic forces between permanent magnets 270 and first and second rotors 215, 220 operate to suspend or hold first and second rotors 215, 220 in a general vertical position without mechanical support and in the absence of power. Thus, when power is not being applied to first and second stators 200, 205 a particular spatial relationship between first stator 200 and first rotor 215 may be maintained, as well as a particular spatial relationship between second stator 205 and second rotor 220.

In one exemplary embodiment, as can be seen in FIG. 2 a Z-drive unit 298 may be coupled to the transport system such that the rotors 215, 220 and their respective stators 200, 205 are movable in the vertical direction. In one embodiment, the rotors may be housed by a moveable chamber or housing 297 within the transfer chamber housing 285. The movable chamber 297 may have an isolated atmosphere (i.e. vacuum, inert gas, controlled air, etc.). In alternate embodiments the moveable chamber 297 may share an atmosphere with the transfer chamber housing 285. Z-drive unit 298 may be coupled to the moveable chamber 297 such that the moveable chamber 297 is moved in the vertical or Z-direction. Any suitable seals 296 may be provided between the moveable chamber 297 and the transfer chamber housing 285 to prevent gas leakage into or out of the transfer chamber 120. The seals 296 may be, for example, any suitable flexible seals such as a bellows seal to allow for the movement of the moveable chamber 297. In alternate embodiments the seals may be any moveable seal that may minimize particle generation during movement of the seal.

The Z-drive unit 298 may be isolated from the internal atmosphere of the transfer chamber 120 and/or the moveable chamber 297. The Z-drive unit 298 may be any suitable drive unit, including, but not limited to, pneumatic, hydraulic, magnetic, or mechanical drive units. In one exemplary embodiment, an uninterrupted power supply may be connected to the Z-drive drive unit 298 (and/or the stators) such that if there is a power outage the transport 105 or a substrate (e.g. wafer) located on the transport within the transfer chamber will not be damaged or collide with any internal components of the transfer chamber or any chambers connected thereto. In alternate embodiments, any suitable mechanical, magnetic, or electrical safety device can be used to prevent damage to the transport and/or substrate located on the transport in the event of a power outage or other system failure. It is noted that any or all of the exemplary embodiments described herein may include the Z-drive unit.

Referring again to FIG. 3A, in alternate embodiments, stators 200, 205 each may include secondary windings 310 that may be energized by controller 240 to vary the vertical position of rotors 215, 220, in relationship to stators 200, 205, respectively. Secondary windings 310 may be positioned and energized to generate additional magnetic forces on rotors 215, 220 such that a vertical electromotive force is exerted on rotors 215, 220. It is noted that the secondary windings may be configured to overcome the magnetic forces of the permanent magnets described above to allow for the vertical movement of the rotors 215, 220. As may be realized the power or magnetic field supplied to the secondary windings may be such that the further the rotors move from the permanent magnets the less magnetic force is exerted on the secondary windings. Secondary windings 310 on rotor 215 may be energized independently of secondary windings 310 on rotor 220, allowing independent control of the vertical positions of rotors 215, 220. In alternate embodiments, secondary windings 310 of each rotor 215, 220 may be synchronously energized so the rotors 215, 220 are moved vertically in unison.

Any suitable transfer or transport assembly may be coupled to first and second rotors 215, 220 for transporting substrates to and from the transfer chamber 120. As can be seen in FIGS. 2 and 3A, in the exemplary embodiment shown, the transfer assembly may include a substrate support, or end effector 210 coupled to a first rotor 215 by a first arm 225 and to a second rotor 220 by a second arm 230. It is noted that the transport assemblies described herein are merely exemplary in nature and it should be realized that any suitable transport may be adapted to the rotor/stator drive configuration described above. First arm 225 is at least rotatably coupled to first rotor 215 in a manner such that first arm 225 rotates in a plane parallel to a plane 275 defined by first rotor 215. In like manner, second arm 230 is at least rotatably coupled to second rotor 220 in a manner such that second arm 230 rotates in a plane parallel to a plane 280 defined by second rotor 220. In this exemplary embodiment the first and second arms 225, 230 may be coupled to a periphery of first and second rotors 215, 220, respectively. In alternate embodiments the first and second arms 225, 230 may be coupled to the first and second rotors 215, 220 at any suitable point and in any suitable manner. As may be realized, the motor output is a leverage force F, F' that may be applied about a fulcrum, which in this example may be a center point of the rotors 215, 220. As can also be seen in FIG. 3A, the force F, F' applied by the motors to their respective rotors 215, 220 is an eccentric force relative to the axis of rotation of a respective one of the rotors 215, 220. The eccentric leverage forces F, F' are shown in FIG. 3A as opposing forces (e.g. causing rotation of the respective rotors in opposite directions) for exemplary purposes only and it should be realized that the direction of the forces may be reversed or be generated so that the rotors rotate in the same direction. It is noted that, in this example, opposing forces cause the end effector 210 to extend and retract while forces in the same direction (causing rotation of the rotors at the same speed in the same direction) cause the transport to rotate without substantial extension or retraction of the end effector 210 as will be described in greater detail below. As may be realized forces generated in the same direction that rotate the rotors at different speeds may extend or retract the end effector 210 while at the same time rotating the transport.

Figure 3B:
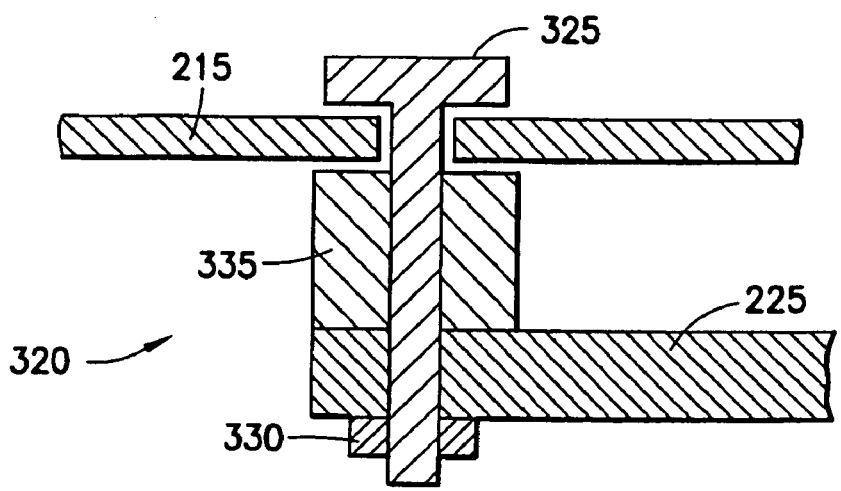
FIG. 3B shows an example of a coupling between an arm and a rotor in accordance with an exemplary embodiment.

FIG. 3B shows an example of a linking assembly 320 that may be used for coupling first or second arm 225, 230 to first or second rotor 215, 220, respectively. In this example, a shaft member 325 or other suitable elongated member extends through first rotor 215 and first arm 225 and is held in place with a retaining mechanism 330. The retaining mechanism may be any suitable retaining mechanism, such as, any suitable mechanical or chemical fasteners (e.g. nuts/bolts, C-clip, cotter pin, etc.). A bushing 335 or other suitable bearing device (which may be integral to the shaft member 325) separates first arm 225 from first rotor 215 and allows first arm to rotate with respect to first rotor 215. In alternate embodiments, a shaft may be fixed to rotor 215 and arm 225 may be mounted onto the shaft with bearings. In alternate embodiments, any other type of coupling may also be used.

Figure 4A:
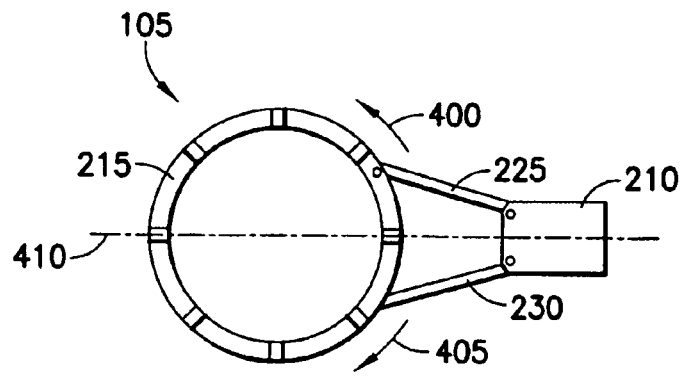
FIGS. 4A-4E are respectively top views showing the substrate transport apparatus of FIG. 3 with the end effector in different locations between an extended and retracted position.
Figure 4B:
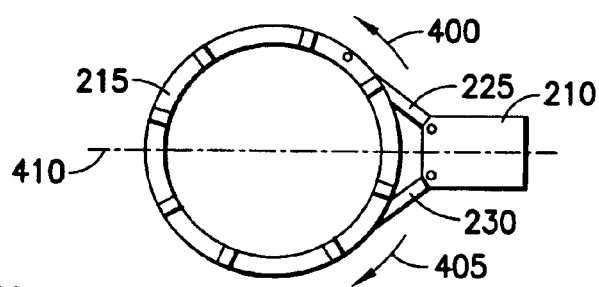
Figure 4C:
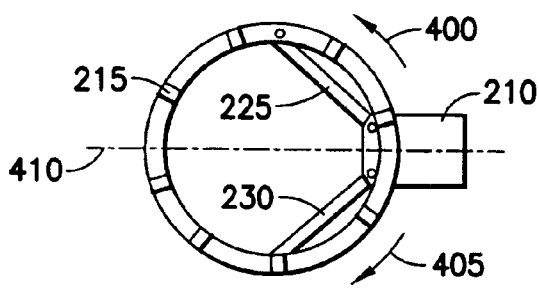
Figure 4D:
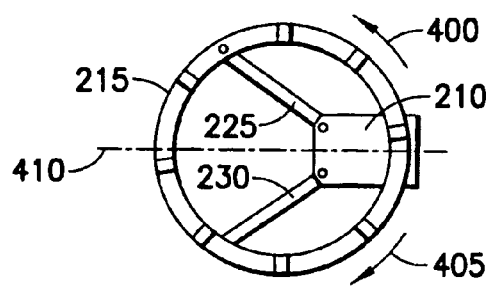
Figure 4E:
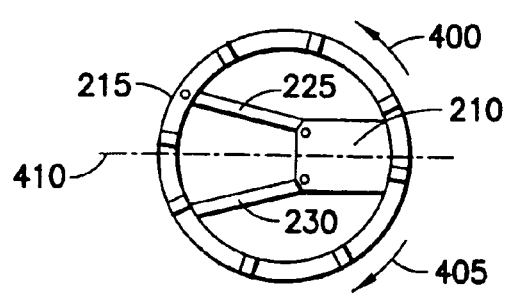

FIGS. 4A-4E show one exemplary type of operation of substrate transport device 105. In the exemplary transport configuration shown in FIG. 4A an end effector 210, first arm 225, and second arm 230 are shown in an extended position. By rotating rotor 215 and rotor 220 in opposite axial directions, as shown by arrows 400 and 405, end effector 210 retracts. If rotor 215 and rotor 220 are operated to rotate synchronously in opposite axial directions 400, 405, respectively, end effector 210 may retract in one direction along a linear path 410. As shown in FIG. 4E, continued operation of rotors 215, 220 in this fashion causes end effector 210 to move to a fully retracted position. It should be understood that by rotating rotors 215, 220 in directions opposite those shown by arrows 400 and 405, end effector 210 may then travel in an opposite direction along linear path 410 toward the extended position.

Figure 5A:
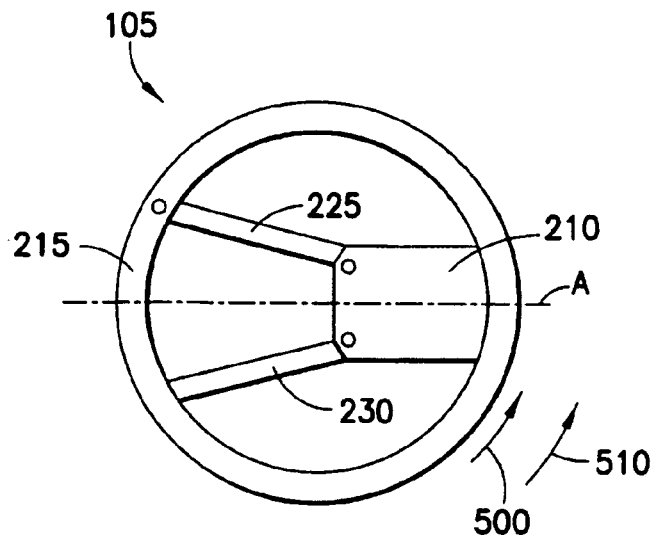
FIGS. 5A-5C are respectively top views showing the end effector of the substrate transport apparatus in three other locations.
Figure 5B:
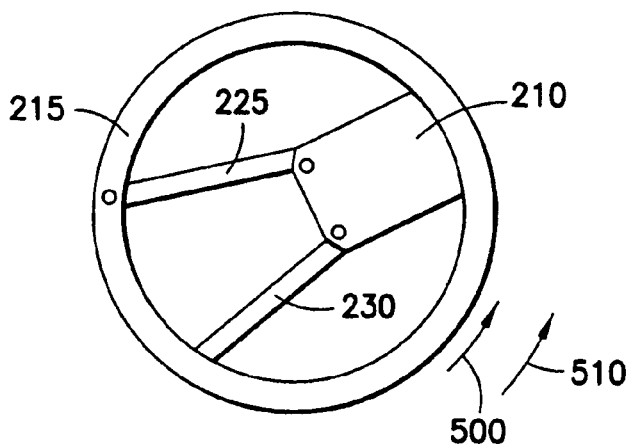
Figure 5C:
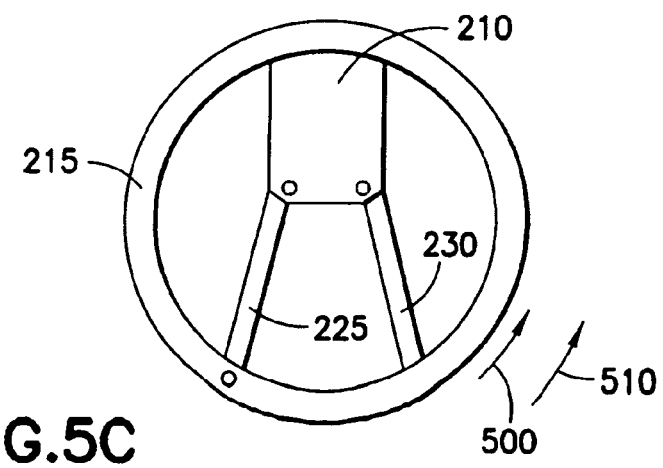

FIGS. 5A-5C show another exemplary type of operation of substrate transport device 105. FIG. 5A shows end effector 210, first arm 225, and second arm 230 in a retracted position, where end effector 210 faces in a direction A. By synchronously rotating rotor 215 and rotor 220 in the same direction, as shown by arrows 500 and 510, respectively, end effector 210 may be rotated axially to face in any desired direction. It should be understood that rotors 215, 220 may be synchronously rotated in a direction opposite that shown by arrows 500, 510, thus rotating end effector 210 in the opposite direction. As described above rotating the rotors in the directions of arrows 500, 510 at the same speed may cause rotation of the transport device 105 with any substantial extension or retraction of the end effector 210.

Controller 240 can apply power to stator 200 and stator 205 such that the movements of substrate transport device 105 shown in FIGS. 4A-4E and FIGS. 5A-5C may be combined, enabling end effector 210 to be placed in any axial location within the various components of substrate processing system 100 (FIG. 1), including transfer chamber 120, processing modules 110, or load locks 115.

Returning now to FIGS. 2 and 3A, first and second rotors 215, 220 may be permanent magnet rotors, each having at least two poles. First and second stators 200, 205 may have at least two primary windings 245. In this embodiment, first stator 200 and second stator 205 are positioned outside transfer chamber 120, while first rotor 215 and second rotor are positioned inside transfer chamber 120. Thus, first and second stators 200, 205 are separated from first and second rotors 215, 220 and isolated from an internal atmosphere of the transfer chamber 120 by a housing 285 of substrate processing system 100 as described in U.S. Pat. Nos. 5,720,590; 5,813,823; and 5,899,658, previously incorporated herein by reference.

In this exemplary embodiment, first stator 200 and first rotor 215 are concentrically positioned with respect to each other, as are second stator 205 and second rotor 220. End effector 210, first arm 225, and second arm 230 are interposed between rotors 215, 220. In alternate embodiments the rotor, stator and the transfer assembly may have any suitable configuration.

Figure 6:
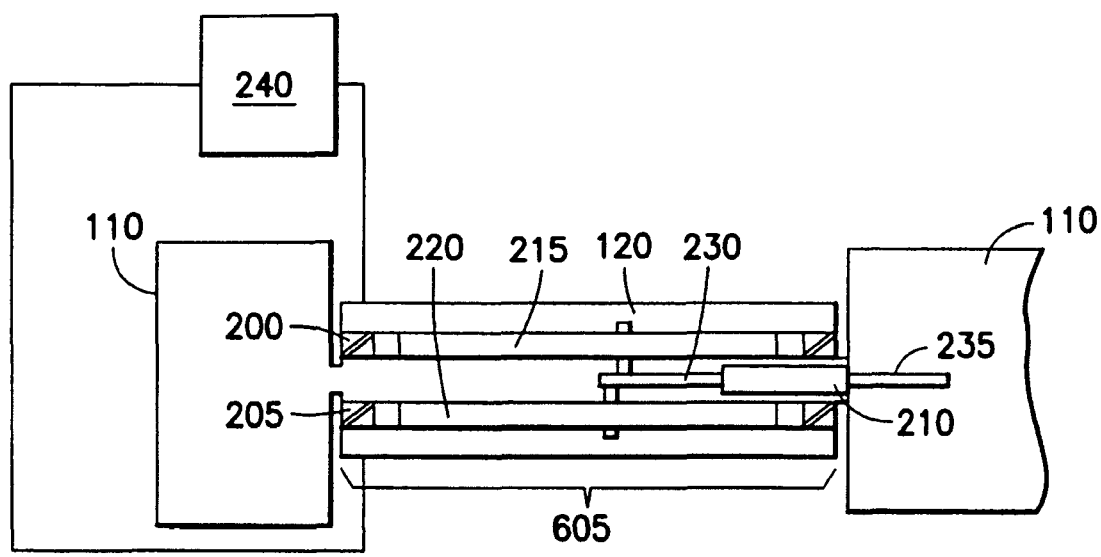
FIG. 6 shows a further exemplary embodiment of the substrate transport apparatus where stators of the apparatus are positioned inside a transfer chamber.

FIG. 6 shows a further exemplary embodiment of a substrate transport device 605. In this embodiment, stators 200, 205 are positioned inside transfer chamber 120. While no mechanical connections are made through the walls of transfer chamber 120 in this exemplary embodiment, electrical connections are made through the walls of transfer chamber 120 to stators 200, 205. The electrical connections may be physical connections (e.g. wired connections) or contactless connections such as through, for example, inductance. The transfer chamber 120 and/or the transfer device 605 in this exemplary embodiment, may be supported in any suitable manner such as by magnets and/or by a Z-drive unit as described above with respect to FIG. 2.

Figure 7:
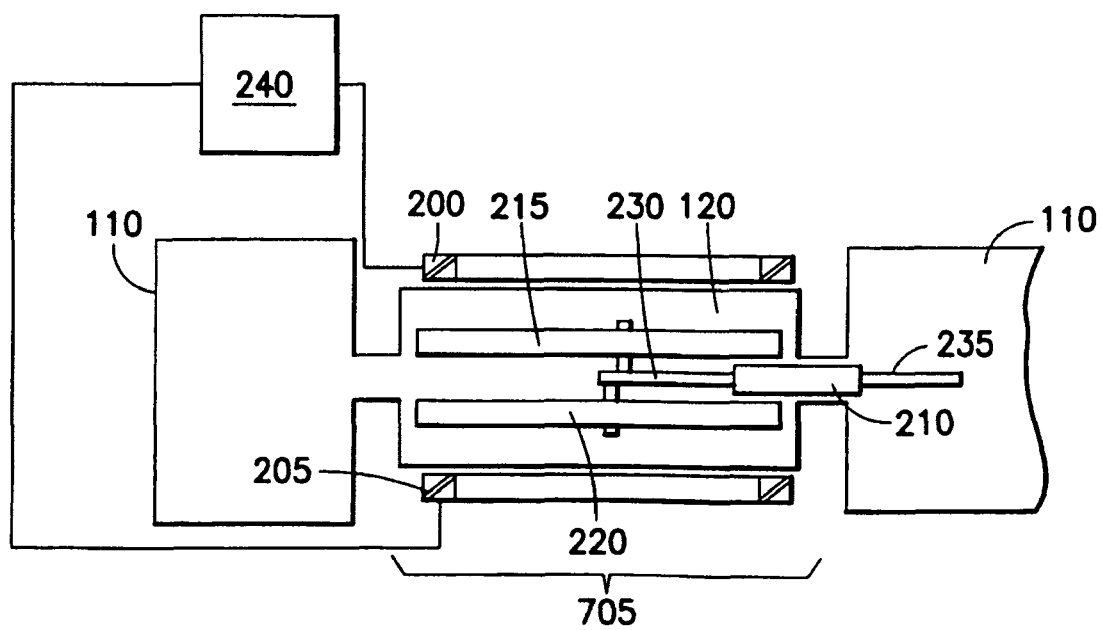
FIG. 7 shows another exemplary embodiment of the substrate transport apparatus where stators of the apparatus are in vertical alignment with rotors of the device.

FIG. 7 shows another exemplary embodiment of a substrate transport apparatus 705. In this embodiment, stators 200, 205 are positioned outside transfer chamber 120, and in vertical alignment with rotors 215, 220, which are located within the transfer chamber 120. End effector 210, first arm 225, and second arm 230 remain interposed between rotors 215, 220. Again, in this exemplary embodiment the transfer chamber 120 and/or transfer apparatus 705 and its drive may be suitably supported and aligned with the processing chambers 110 in any suitable manner, such as by, for example, magnets and/or the Z-drive unit described above with respect to FIG. 2.

Figure 8:
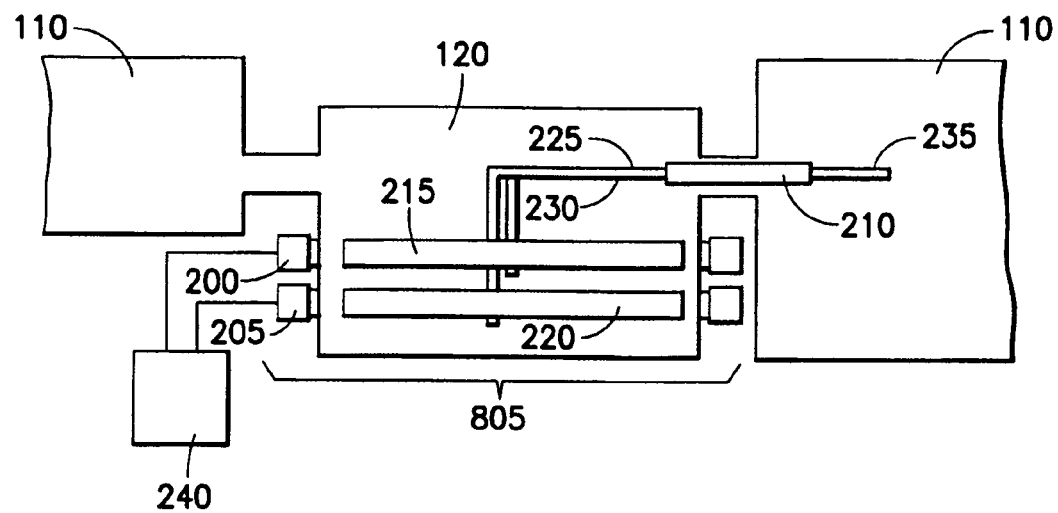
FIG. 8 shows still another exemplary embodiment where the stators and rotors are vertically offset from the end effector.

FIG. 8 shows still another exemplary embodiment of a substrate transport apparatus 805. In this exemplary embodiment, rotors 215, 220 are concentrically positioned and horizontally aligned with respect to their respective stators 200, 205. End effector 210, first arm 225, and second arm 230 are vertically offset from rotors 215, 220 and stators 200, 205. In this exemplary embodiment the transport apparatus 805 and/or the transfer chamber 120 may be suitably supported in the Z-direction as described above. In alternate embodiments, the transfer chamber 120 and/or transfer apparatus 805 may be suitably vertically supported in any suitable manner.

Figure 9:
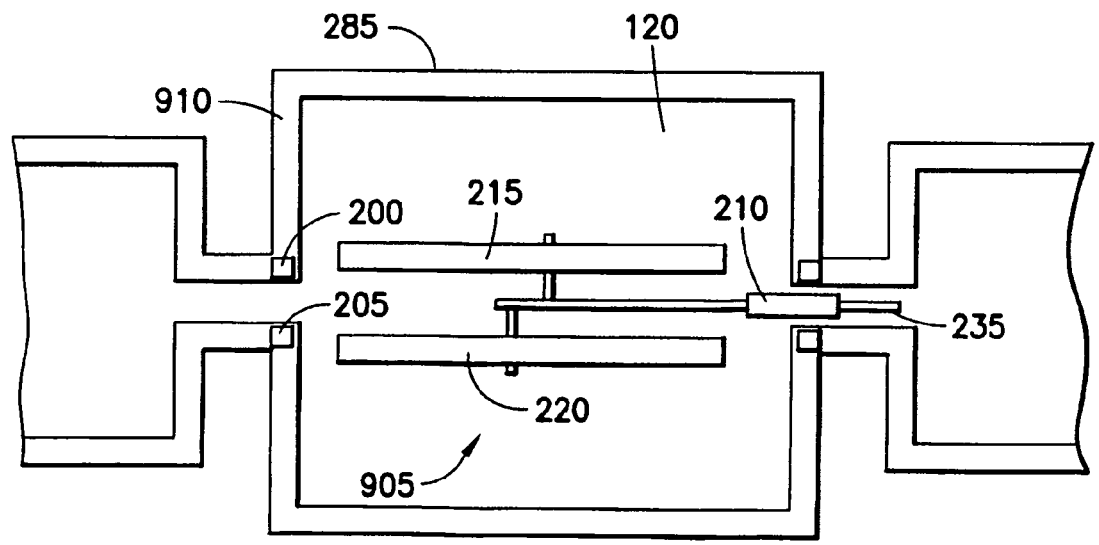
FIG. 9 shows yet another exemplary embodiment where the stators are integrated into a housing of the substrate processing system.

FIG. 9 shows yet another exemplary embodiment of a substrate transport apparatus 905. Similar to the exemplary embodiment shown in FIG. 2, first stator 200 and first rotor 215 are concentrically positioned with respect to each other, as are second stator 205 and second rotor 220. End effector 210, first arm 225, and second arm 230 are interposed between rotors 215, 220. In this exemplary embodiment, first stator 200 and second stator 205 are embedded or otherwise integrated into housing 285. As shown, first and second stator 200, 205 are embedded in a wall 910 of housing 285. Again it is noted that the transport apparatus 905 and/or the transfer chamber 120 may be vertically supported in any suitable manner. For example, in one embodiment the Z-drive unit 298 described above with respect to FIG. 2 may be suitably coupled to the transfer chamber 120 and/or the transport apparatus 905. In alternate embodiments, the transport apparatus 905 may be vertically supported by, for example, magnetic interaction between the rotors and stators.

By proper design and use of magnetic and non-magnetic materials, it is possible to mount all moving parts, including motor rotors, inside of transfer chamber 120, while placing the magnetic coils, such as the motor stators, outside the transfer chamber 120 or embedding the magnetic coils within the chamber housing 285 (e.g. placed within/integral to or recessed into walls of the housing). For example, the transfer chamber housing 285 may be made of a non-magnetic material allowing the magnetic stators to function while mounted to the outside of, or embedded in the housing 285. Locating the stators outside or within the walls of the housing may eliminate known outgassing problems and electrical feedthroughs that degrade performance of systems having active electromagnets in a vacuum environment.

Figure 12:
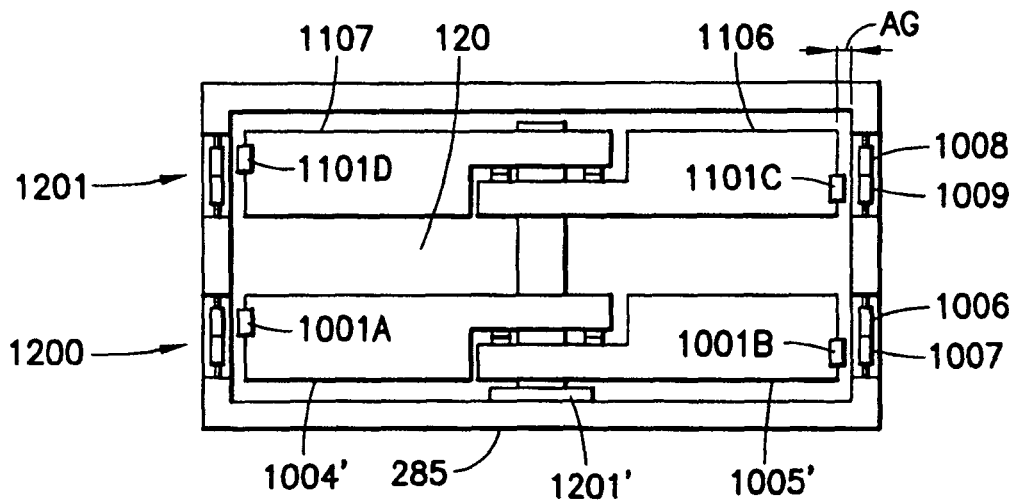
FIG. 12 shows a side view of the substrate transport apparatus of FIGS. 11A and 11B.

As can be seen in the Figures, for example FIGS. 9 and 12, the housing 285 of the transfer chamber 120 may provide a non-magnetic barrier separating the vacuum region or inside of the chamber from the atmospheric region or outside of the chamber. As such, the transfer chamber 120 may have a portion of the housing 285 that passes between, for example, rotor 1106, and stator 1009. As such, sufficient clearance or an air gap AG, as shown in FIG. 12, may be provided between the rotor 1106 and the chamber housing 285. The air gap AG may be maintained in any suitable manner. For example, in the exemplary configuration shown in FIG. 12, the air gap is maintained through the utilization of shaft 1201'. In other exemplary embodiments, the drive system of the transfer apparatus may be configured as a self bearing drive system where the air gap is maintained by, for example, magnetic forces between the stators and rotors.

Figure 10:
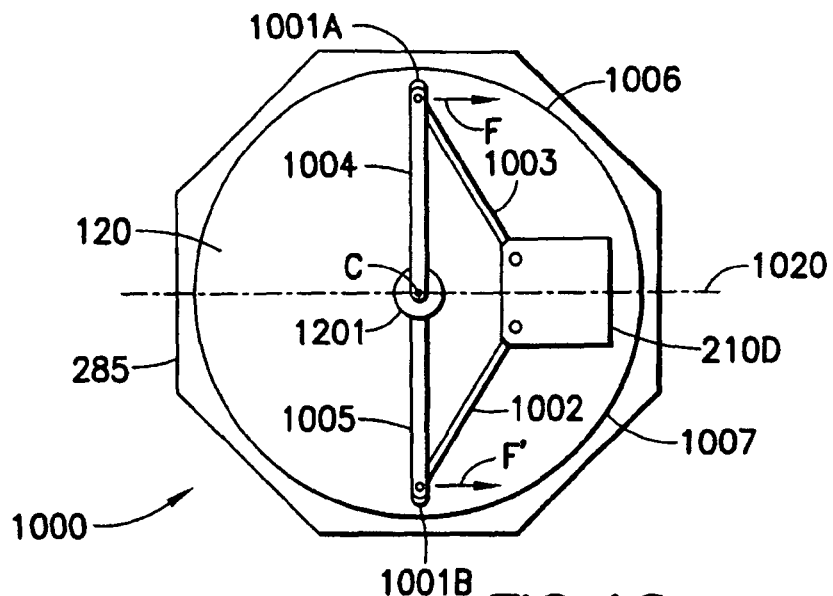
FIG. 10 shows a schematic top plan view of a substrate transport apparatus in accordance with an exemplary embodiment.
Figure 13:
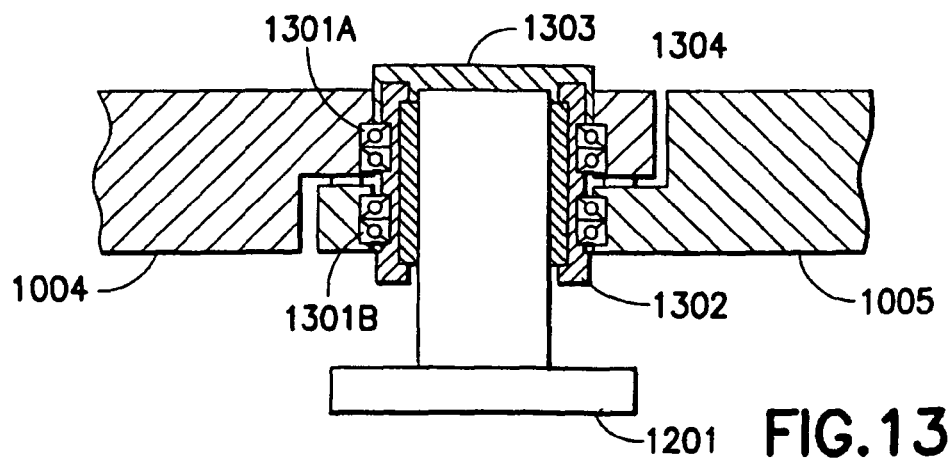
FIG. 13 shows a partial side view of the substrate transport apparatus of FIG. 10.
Figure 19:
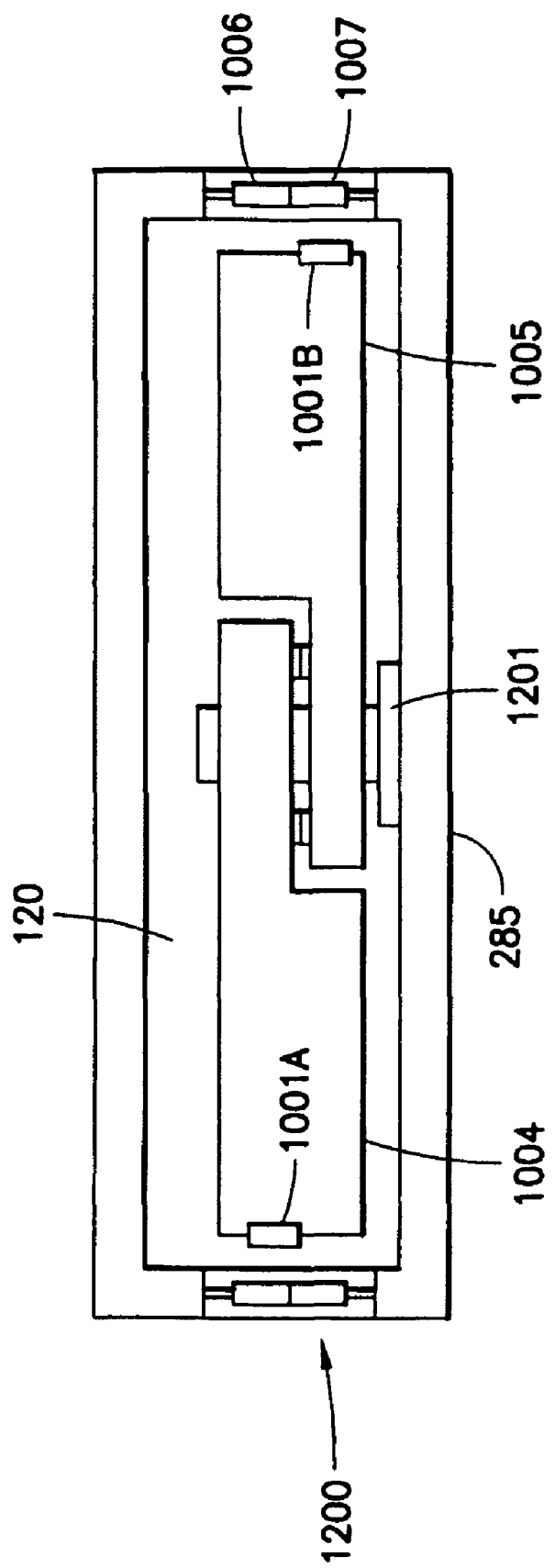
FIG. 19 shows a side view of the substrate transport apparatus of FIG. 10.

Referring now to FIGS. 10, 13 and 19, another exemplary embodiment of a substrate transport apparatus 1000 is shown. In this exemplary embodiment the transport apparatus 1000 comprises stators 1006, 1007 (stators 1006, 1007 can be seen best in FIG. 19), a first and second rotor link 1004, 1005, a first and second arm link 1002, 1003 and a substrate support or end effector 210D. This exemplary embodiment is similar to that shown in FIGS. 2 and 3A except for the rotor being in the form of a link or spoke rather than ring shaped as will be described below. It is noted that while the links 1002-1005 are shown in the Figures as having a substantially straight configuration, in alternate embodiments the links 1002-1005 may have any suitable shape or configuration including, but not limited to, curved or other geometrical shapes.

Stators 1006 and 1007 may be substantially similar to stators 200 and 205 with the exception of there being no permanent magnets 270 effecting the magnetic bearing described above. It is again noted that the stators 1006, 1007 may be located within the transfer chamber 120 or isolated from an atmosphere of the transfer chamber 120 as described above. Stators 1006 and 1007 may have primary windings that, when energized, exert a magnetic torque on rotor links 1004, 1005 as will be described below. In this exemplary embodiment the stators 1006, 1007 are shown as being concentrically stacked above one another (FIG. 19), for example stator 1006 is located above stator 1007. In alternate embodiments, the stators may have any other suitable configuration.

In this exemplary embodiment, the exemplary first and second rotor links 1004, 1005 are pivotable about the center C of the transfer chamber 120. In alternate embodiments the first and second rotor links may be pivotable about any desired location within the transfer chamber. The first and second rotor links 1004, 1005 may be rotatably mounted on a shaft 1201 as can be seen best in FIG. 13. Shaft 1201 may be located at the center C of the transfer chamber 120. In alternate embodiments the transport may be configured so the shaft 1201 may be located at any desired location within the transfer chamber. A bearing support sleeve 1302 may be mounted on shaft 1201. The bearing support sleeve 1302 may be slip fit or press fit over the shaft 1201. In alternate embodiments, any suitable manner of fitting the bearing sleeve to the shaft may be used. In this example, bearing 1301A is fitted over the top of the bearing sleeve 1302 and bearing 1301B is fitted over the bottom of the bearing sleeve 1302. Bearings 1301A, 1301B may be any suitable bearing for supporting vertical and/or radial loads. The bearings 1301A, 1301B may be press fit on bearing support sleeve 1302. In alternate embodiments, any suitable manner of fitting the bearing on the support sleeve may be used. In other alternate embodiments, the shaft 1201 may be a spline shaft and the bearing support sleeve may have linear spline guides 1304 that prevent rotation of the bearing support sleeve while at the same time, allowing vertical movement of the transporter 1000 along the spline shaft. In still other alternate embodiments, the bearings may be mounted or otherwise affixed to the shaft without a bearing support sleeve.

A proximate end of the first rotor link 1004 may, for example, be rotatably mounted on shaft 1201 via bearing 1301A and the proximate end of the second rotor link 1005 may be rotatably mounted on shaft 1201 via bearing 1301B. The proximate ends of the rotor links may be connected to the bearing in any suitable manner. In alternate embodiments the first and second rotor links 1004, 1005 may be rotatably mounted on the shaft 1201 in any suitable manner. A cover 1303 or cap may be provided over the shaft/bearing assembly to prevent any particles that may be generated by the bearings from being released into the transfer chamber 120. In alternate embodiments any suitable particle containment device may be used such as for example, a vacuum or fan. Distal ends of the first and second rotor links 1004, 1005 extend radially from the shaft 1201, which in this example coincides with the center C of the transfer chamber 120, towards the outer walls of the chamber 120. In alternate embodiments the shaft 1201 may be located away from the center C of the transfer chamber. Magnets 1001A, 1001B may be mounted on the distal ends of the rotor links 1004, 1005 respectively. Magnets 1001A, 1001B may be permanent magnets with, for example, two poles. The magnets may have any suitable shape including, but not limited to, an arc segment or platen, a block and/or a disk. In alternate embodiments any suitable type and/or shape magnets may be used. Rotor link 1004 and magnet 1001A may interact with the stator 1006 to form a first motor while rotor link 1005 and magnet 1001B may interact with stator 1007 to form a second motor. The motors may be three phase motors that are segmented such that sections of the motor can be controlled independently to operate different linkages on the same motor armature. In alternate embodiments the motors may have any suitable number of phases. A controller, such as controller 240, may be used to apply power to the windings of stators 1006, 1007 as described above with respect to stators 200, 205 of FIG. 2.

In this exemplary embodiment, a proximate end of a first arm link 1003 is rotatably connected to the distal end of the first rotor link 1004 and a distal end of the first arm link 1003 is rotatably connected to end effector 210D. A proximate end of a second arm link 1002 is rotatably connected to the distal end of the second rotor link 1005 and the distal end of arm link 1002 is rotatably connected to end effector 210D. Arm links 1002, 1003 may be rotatably connected to the rotor links 1004, 1005 by any suitable connection, such as for example, a pinned or bolted connection as shown in FIG. 3B. The arm links 1002, 1003 may be connected to the end effector in substantially the same manner using, for example, a pinned or bolted connection. The connection between arm links 1003, 1002 with the end effector 210D may be configured such that a longitudinal axis of end effector 210D remains along an axis of extension/retraction 1020 as the transport 1000 moves from its extended and retracted positions.

The operation of the transport apparatus 1000 shown in FIG. 10 is substantially the same as that described above with respect to FIGS. 4A-E and FIGS. 5A-5C. However, instead of the drive having ring shaped rotors, the rotors in this exemplary embodiment take the form of links 1004, 1005. For example, each stator 1006, 1007 produces an eccentric magnetic leverage force on a respective one of the links 1004, 1005 that is applied about a fulcrum, which in this example may be the center point C at which the shaft 1201' is located. The eccentric leverage forces F, F' are shown in FIG. 10 for exemplary purposes only and it should be realized that the direction of the forces may be reversed. The leverage force creates a torque on its respective rotor link 1004, 1005, which, if applied with enough force, causes its respective rotor 1004, 1005 to rotate. Controller 240 may be capable of applying power to stators 1006, 1007 such that rotor links 1004 and 1005 rotate axially, either independently or synchronously. Controller 240 may also be capable of applying power independently to stator 1006 to control the axial position of rotor 1004 and may be capable of applying power independently to stator 1007 to control the axial position of rotor 1005. When the rotors 1004, 1005 are energized to rotate in opposite directions, for example, when rotor link 1004 rotates clockwise and rotor link 1005 rotates counterclockwise, the end effector may travel along linear path 1020 toward an extended position and vice versa.

In one exemplary configuration, each of the stators 1006, 1007 may also include secondary windings which may be energized by, for example, controller 240 to vary the vertical position of rotor links 1004, 1005, in relationship to stators 1006, 1007, respectively. In this example, the rotors may be free to move vertically along the shaft 1201. Secondary windings may be positioned and energized to generate additional magnetic forces on rotor links such that a vertical electromotive force is exerted on rotors 1006, 1007 causing rotors 1006, 1007 to ride along, for example, the linear spline guides 1304 on shaft 1201. In alternate embodiments, secondary windings on rotor 1006 may be energized independently of secondary windings on rotor 1007, allowing independent control of the vertical positions of rotors 1006, 1007. In other alternate embodiments the secondary windings may form a self bearing motor to maintain a sufficient air gap between the rotors and walls of the housing and to support the rotors as a desired height. An uninterrupted power supply may be connected to the secondary windings to prevent the rotors/transfer apparatus drive system from colliding with anything during a power outage. In other exemplary configurations, a Z-drive, similar to drive 298 may be coupled to the shaft 1201 to provide vertical movement of the transfer apparatus.

Although stators 1006, 1007 are shown in the Figures as being integrated into the housing 285, it should be understood that stators 1006, 1007 can have other configurations such as, for example, the configurations shown in FIGS. 2 and 6-8.

Figure 21:
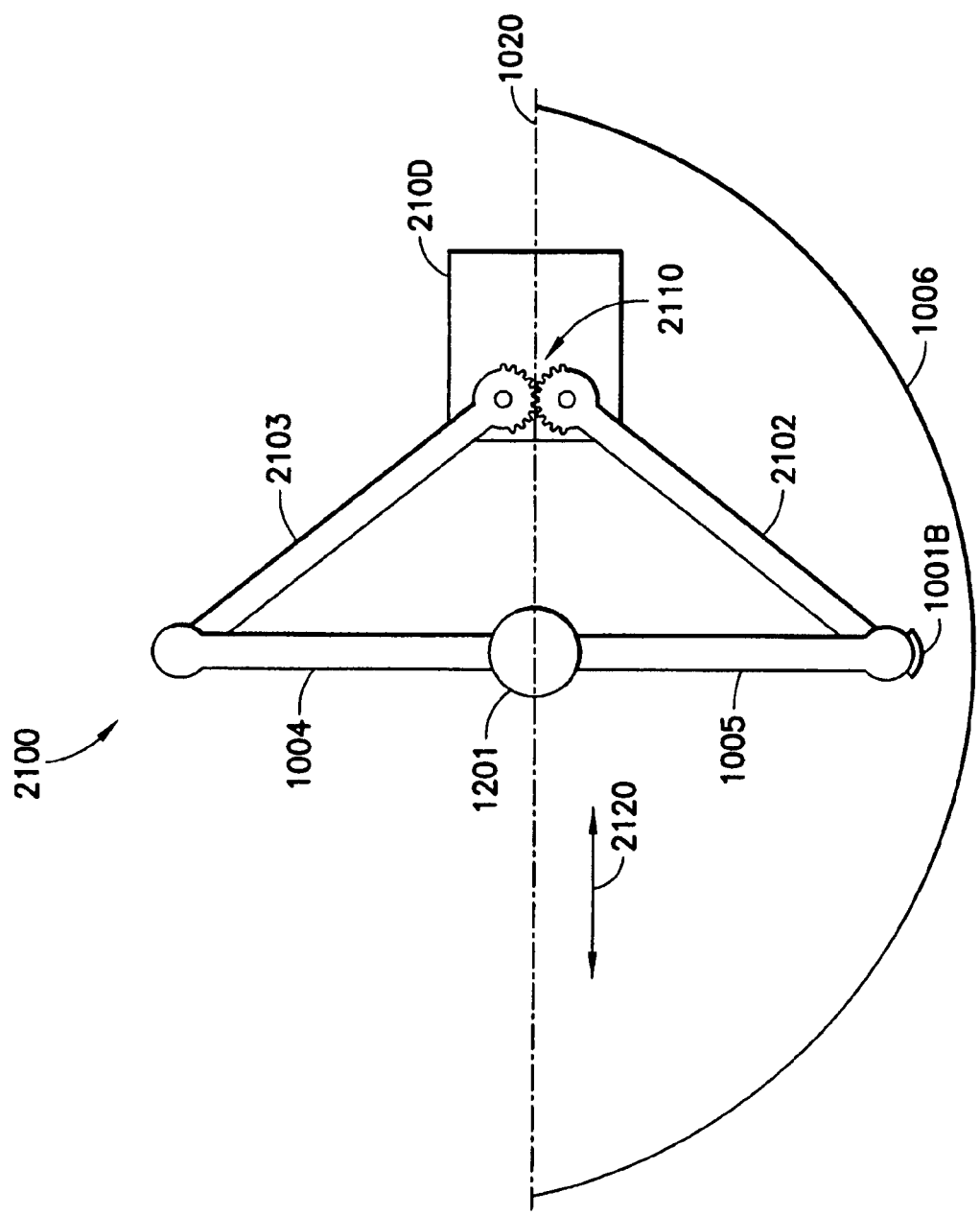
FIG. 21 schematically illustrates a portion of an exemplary transport apparatus in accordance with an exemplary embodiment.

In other exemplary embodiments, where the transport is supported on a shaft as shown, for example, in FIGS. 10, 13 and 19, the rotatable coupling between the end effector 210D and the arm links 1002, 1003 may be such that the respective coupling of each arm link interact with one another. For example, as can be seen in FIG. 21, another exemplary transport apparatus 2100 is shown. The transport apparatus may be substantially similar to the transport apparatus described above with respect to FIGS. 10, 13 and 19. However, in this exemplary embodiment distal ends of each of the arm links 2102, 2103 include, for example, teeth 2110 or other suitable meshing features that are configured to maintain radial or longitudinal alignment of the end effector 210D along a path of extension/retraction 1020 as the end effector is moved radially in the direction of arrow 2120. The teeth may also serve to link the movement of arm link 2103 with arm link 2102 so that arm link 2102 drives arm link 2103. As can also be seen in FIG. 21, in this exemplary embodiment only rotor link 1005 has magnets 1001B affixed to its distal end (in alternate embodiments the magnets may be located on rotor link 1004). The meshing engagement between the arm links 2102, 2103 may allow the transport to be extended and retracted with only one motor 1006, 1001B.

Figure 11A:
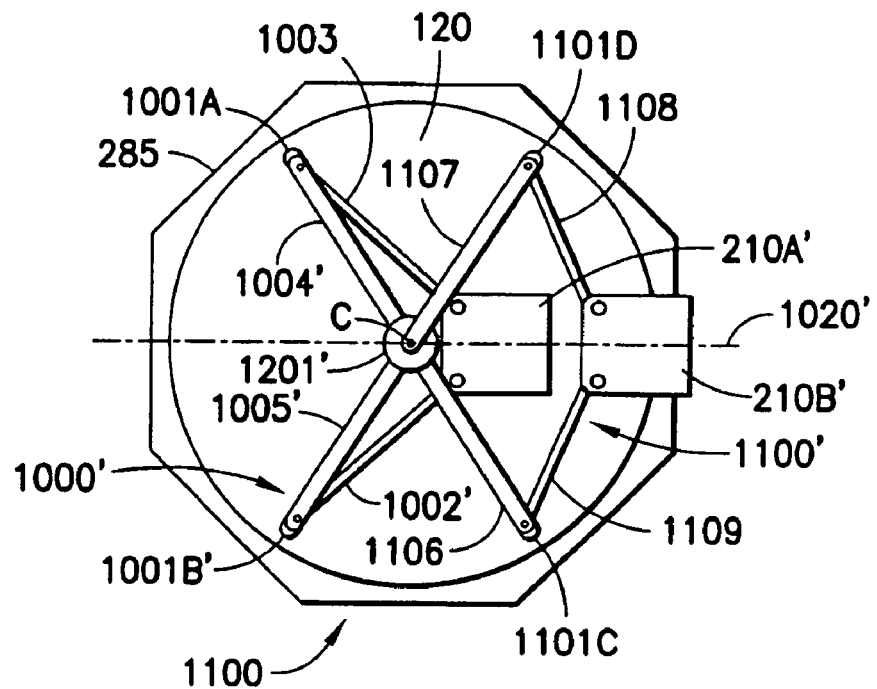
FIG. 11A shows a schematic top plan view a substrate transport apparatus in accordance with another exemplary embodiment.
Figure 11B:
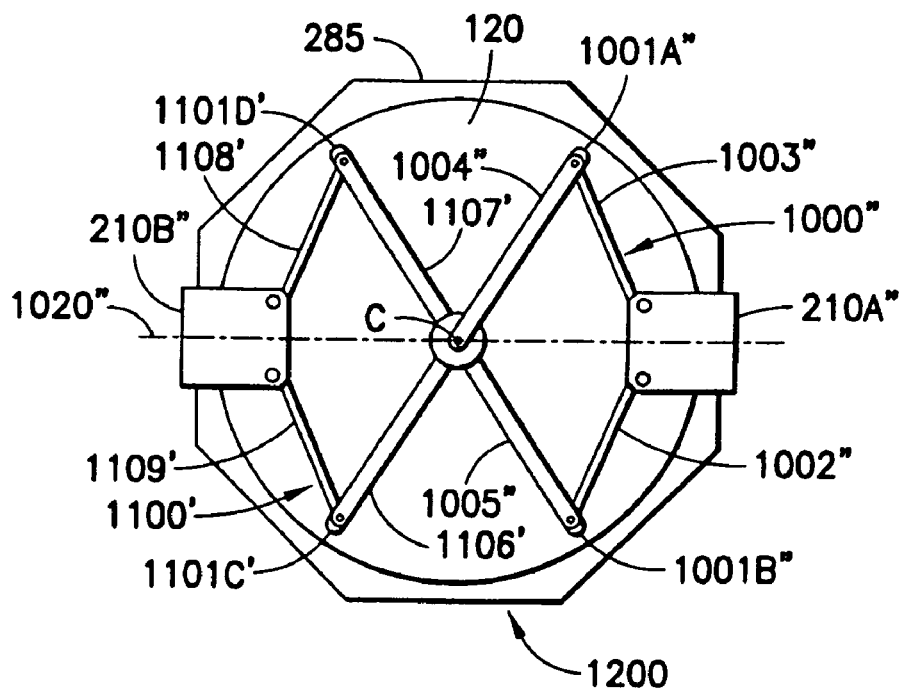
FIG. 11B shows a schematic top plan view a substrate transport apparatus in accordance with of still another exemplary embodiment.

Referring now to FIGS. 11A, 11B and 12, dual end effector transport apparatus 1100, 1200 are shown. The dual end effector transport apparatus 1100, 1200 may have, for example, two transports 1000', 1100' (as in FIG. 11A) or 1000", 1100" (as in FIG. 11B). The dual end effector transport apparatus may have one transport located above the other transport, for example, in FIG. 11A transport 1100, is shown as being located above transport 1000'. Transports 1000', 1100', 1000" and 1100" are substantially similar to transport 1000 described above. As such, similar features will have similar reference numbers. It is noted that while the rotors in the exemplary embodiments shown in FIGS. 11A, 11B and 12 are described as being supported on shaft 1201' it should be realized that the rotors may be supported in a self bearing fashion as described above with respect to FIGS. 2-9. It is also noted that the exemplary drive system of FIGS. 11A, 11B and 12 may include a Z-drive unit as described above with respect to FIG. 2 where the Z-drive unit may be coupled to the transfer chamber and/or the shaft 1201'.

The transfer chamber 120 may have an upper motor ring 1201 and a lower motor ring 1200 integrated or embedded into its housing 285 substantially similar to that shown in FIG. 12. The upper and lower motor rings 1201, 1200 may each contain two stators, 1008, 1009 and 1006, 1007 respectively, for magnetically driving the rotor links 1004', 1005', 1106, 1107. Although stators 1006-1009 are shown in the FIG. 12 as being integrated into the housing 285, in alternate embodiments the stators may be configured in substantially the same manner as that shown in FIGS. 2 and 6-8. Rotor links 1004', 1005', 1106, 1107 may be mounted on shaft 1201' in a manner substantially similar to that described for transport 1000 and as shown in FIG. 13.

Rotor links 1106, 1107, of the upper transport 1100' may be driven by the upper motor ring 2101 where for example, rotor link 1107 is driven by stator 1008 and rotor link 1106 is driven by stator 1009. Rotor links 1004', 1005' of the lower transport 1000' may be driven by the lower motor ring 1200 where, for example, rotor link 1004' is driven by stator 1006 and rotor link 1005' is driven by stator 1007. Rotor links 1106, 1107 and 1004', 1005' may be driven by their respective stators in a manner substantially similar to that described for transport 1000.

Referring now to FIGS. 11A and 12, the operation of the transport apparatus 1100 will now be described. Transport 1000' and transport 1100' may be extended or retracted individually or in unison by, for example, a controller such as controller 240. The operation of each transport 1000', 1100' is substantially similar to the operation of transport 1000 described above. For example, stator 1008 of the upper motor ring may be energized exerting an eccentric leverage force to produce a magnetic torque on rotor link 1107 so that rotor link 1107 is rotated about, for example, the center C of the transfer chamber 120 in a clockwise or counterclockwise direction. Likewise, stator 1009 of the upper motor ring may be energized exerting a magnetic torque on rotor link 1106 so that rotor link 1106 is rotated in a corresponding clockwise or counterclockwise direction. Rotor links 1106, 1107 have magnets 1101C, 1001D respectively on their distal ends. As the rotor links 1106, 1107 are rotated their distal ends either come together or move apart causing the proximate ends of arms 1108, 1109 to also come together or move apart which in turn causes the end effector 210B to extend or retract along axis 1020'. As can be seen in FIG. 11A end effectors 210A', 210B' may both extend and retract in the same direction, that is end effectors 210A', 210B' both face the same processing chamber 110 or load lock 115 of the processing system 100. This may allow for the fast swap of substrate from or to a load lock, a processing chamber or any other desired location.

Similarly, transports 1100' and 1000'' of transport apparatus 1200 shown in FIG. 11B operate in substantially the same way as transports 1100', 1000'' of transport apparatus 1100 as described above. However, instead of facing the same direction, transports 1100', 1000'' may face opposite directions so that end effectors 210A'', 210B'' are extended and retracted substantially about 180 degrees apart from each other. For example, controller 240 may be configured so that the upper and lower motor rings 1201, 1200 and their respective stators 1006, 1007, 1008, 1009 are energized in unison or separately so that each transport 1100', 1000'' may be extended or retracted individually or in unison. In alternate embodiments, each of the transports may be rotated clockwise or counterclockwise, either individually or in unison, about the center C or any other desired position of the transfer chamber in a manner substantially similar to that described above.

In alternate embodiments, referring to FIG. 11B, each of the transports 1100' and 1000'' may be independently rotatable about shaft 1201' such that the end effectors 210A'' and 210B'' can be extended and retracted in the same direction, opposite directions or at any suitable angular relationship to each other. For example, the transports 1100', 1000'' may be independently rotated to face the same direction (as shown in FIG. 11A) or they may be independently rotated so they extend/retract along paths that are at right angles (or any other suitable angle) apart from each other.

Figure 14:
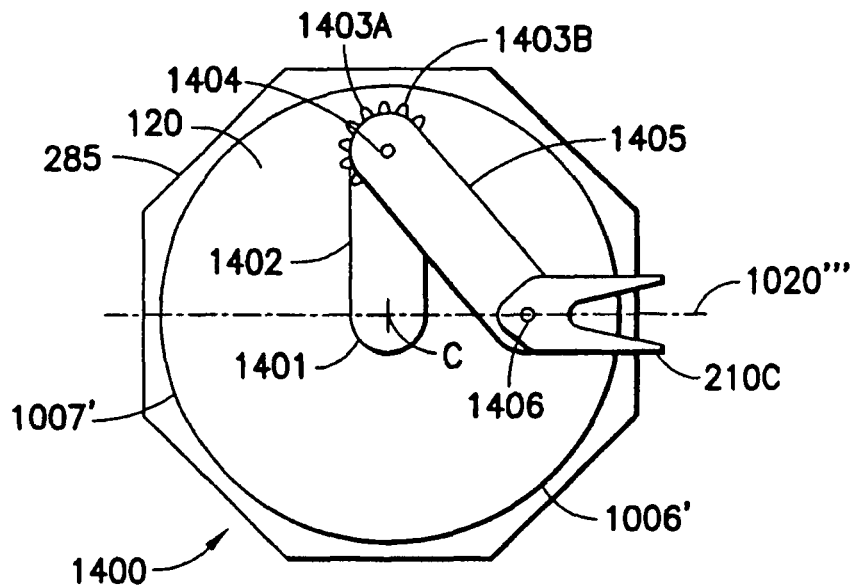
FIG. 14 shows a schematic top plan view of a substrate transport apparatus in accordance with yet another exemplary embodiment.
Figure 16:
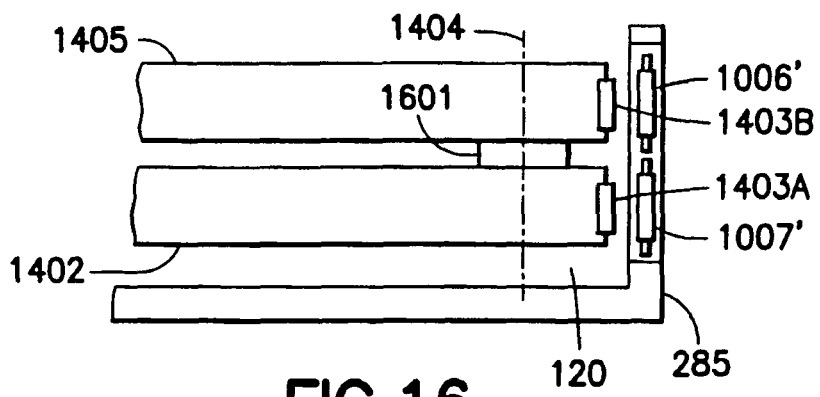
FIG. 16 shows a partial side view of the substrate transport apparatus of FIG. 14.

Referring now to FIGS. 14 and 16, another transport apparatus 1400 in accordance with an exemplary embodiment will now be described. It is noted that the transport apparatus 1400 in this example is illustrated as a SCARA type transport for exemplary purposes only to illustrate that the transport apparatus drive system described herein can be applied to any suitable transfer arm/device. The SCARA transport may have stators 1006', 1007', an upper arm 1402, a forearm 1405 and an end effector or substrate holder 210C.

Stators 1006', 1007' are substantially similar to stators 1006, 1007 as described with respect to transports 1100 and 1200. Also, stators 1006' and 1007' may be controlled by, for example, controller 240 in substantially the same manner as described above for stators 1006, 1007.

The upper arm 1402 may be rotatably mounted to the center C of a disk or rotor substantially similar to that described above with respect to FIGS. 2 and 3, at a shoulder joint 1401. In alternate embodiments the upper arm 1402 may be a disk or rotor as described above with respect to FIGS. 2 and 3 where, for example, the upper arm is rotatably coupled to the disk at an eccentric location. In other alternate embodiments the upper arm may have any suitable configuration. The upper arm 1402 and its respective stator may form a self bearing motor. In alternate embodiments the upper arm may be mounted to the center of the transfer chamber and supported in any suitable manner. In still other alternate embodiments the SCARA transport may be configured so that the transport may be placed in any desired location within the transfer chamber. The forearm 1405 is rotatably mounted on the upper arm 1402 at, for example, an elbow joint 1404. The upper arm 1402 and the forearm 1405 may be rotatably joined via a support shaft 1601 mounted to the upper arm 1402. The support shaft 1601 may have any suitable configuration and extend through the forearm 1405. The support shaft 1601 may have suitable bearings to support the forearm 1405 while at the same time, allowing rotational movement of the forearm 1405 about the elbow joint 1404. In alternate embodiments, the upper arm and forearm may be joined in any suitable manner. End effector 210C is rotatably mounted to forearm 1405 at a wrist joint 1406 in a substantially same manner to that described above with respect to the forearm and upper arm.

In this exemplary embodiment the stators 1006', 1007' may be integrated or embedded into the transfer chamber housing 285, as can be seen in FIG. 16 and as described above, substantially forming a ring around the substrate transport 1400. In alternate embodiments the stator may form any suitable shapes relative to the substrate transport 1400. Stators 1006', 1007' may be concentrically stacked, one above the other, as shown in FIG. 16. In alternate embodiments the stators may have any other desired configuration such as, for example, the configuration shown in FIGS. 2 and 6-8. In this exemplary embodiment, the upper arm 1402 extends radially from the center C of the transfer chamber 120 towards the walls or housing 285 of the chamber 120 and towards the stators 10061, 10071. Magnets 1403A may be fixedly mounted on the distal or elbow end of the upper arm 1402 so that upper arm 1402 may act as a rotor. Upper arm 1402 and magnets 1403A interact with, for example, stator 1007' forming a first motor. Magnets 1403B may also be fixedly mounted to the proximate or elbow end of forearm 1405 so that forearm 1405 may act as a rotor. Forearm 1405 and magnets 1403B interact with, for example, stator 1006' forming a second motor. Magnets 1403A, 1403B may be substantially similar to those described above with respect to transports 1000, 1100 and 1200.

End effector 210C is rotatably mounted on a distal end of the forearm 1405 at a wrist joint 1406. The end effector 210C may be mounted to the forearm 1405 in substantially the same manner that forearm 1405 is mounted to the upper arm 1402 as described above. The end effector 210C may be a paddle type end effecter employing vacuum gripping of a substrate or a forked end effector having active or passive edge gripping. In alternate embodiments, any suitable end effector and substrate gripping method may be used. The end effector 210C may be configured so that the longitudinal axis of the end effector 210C remains along the axis of radial extension or retraction 1020''' as the transport 1400 moves from an extended position to a retracted position and vice versa.

In one exemplary embodiment, the arm may have a slaved configuration where only the upper arm acts as a rotor. For example, there may be a shoulder pulley, an elbow pulley and a wrist pulley (not shown) located within the upper arm and forearm. The shoulder, elbow and wrist pulleys may have their center of rotation respectively located at the shoulder 1401, the elbow 1404 and the wrist 1406. The shoulder pulley may be, for example, fixedly connected to a stationary point in the transfer chamber so that when the upper arm rotates about the shoulder the shoulder pulley remains fixed or stationary. The elbow pulley may consist of two pulleys, one being an idler pulley that is drivingly connected to the shoulder pulley while the other is a drive pulley that is fixedly connected to the idler pulley. The elbow drive pulley may be drivingly connected to the wrist pulley, which in turn is fixedly connected to the end effector 210C. The pulleys may be configured so that as the transport 1400 extends or retracts the elbow pulley is driven by the shoulder pulley via the rotation of the upper arm 1402, which in turn drives the wrist pulley in such a way that the longitudinal axis of the end effector remains along the axis of radial extension 1020'''.

Referring still to FIGS. 14 and 16, the operation of the exemplary SCARA transport 1400 will now be described. The operation of the transport apparatus 1400 shown in FIG. 14 is substantially the same as that discussed above with respect to FIG. 10. However, instead of having two rotor links rotating about the center C of the chamber 120, in this example, only the upper arm 1402 rotates about the center C of chamber 120 while the forearm 1405 rotates about the elbow 1404. For example, stator 1007', when energized, produces an eccentric magnetic leverage force that produces a torque on upper arm 1402, which, if applied with enough force, causes upper arm 1402 to rotate in either a clockwise or counterclockwise direction about point C. Forearm 1402 is rotated in a similar fashion about the elbow 1404 by the magnetic torque produced by stator 1006'.

When the upper arm 1402 and forearm 1405 are caused to rotate in opposite directions via the magnetic torque exerted on them by stators 1006', 1007', for example, when upper arm 1402 rotates clockwise and forearm 1405 rotates counterclockwise, the end effector 210C may travel along linear path 1020''' toward an extended position and vice versa. Alternatively, the entire transport 1400 may be rotated about the shoulder 1401 or the center C of chamber 120 in a clockwise or counterclockwise direction via the controller energizing stator 1007' so that only the upper arm 1402 is rotated. Where only the upper arm 1402 is rotated, the forearm 1405 and the end effector 210C may remain in their relative position and may be naturally rotated with the upper arm 1402. In alternate embodiments both stators 1006', 1007' may be configured so that when energized they may effect the rotation of transport 1400 as a unit about the shoulder 1401.

As described above, stators 1006', 1007' may also include secondary windings which may be energized by controller 240 to vary the vertical position of the upper arm 1402 and the forearm 1405, and thus the transport 1400. In alternate embodiments, the vertical position of the transport may be controlled or varied in any suitable manner such as, for example, by a linear motor. In other alternate embodiments, the shaft 1601 may be configured to allow vertical travel of the forearm 1405 along the shaft such that the secondary windings may cause vertical movement of the forearm relative to the upper arm.

Figure 15:
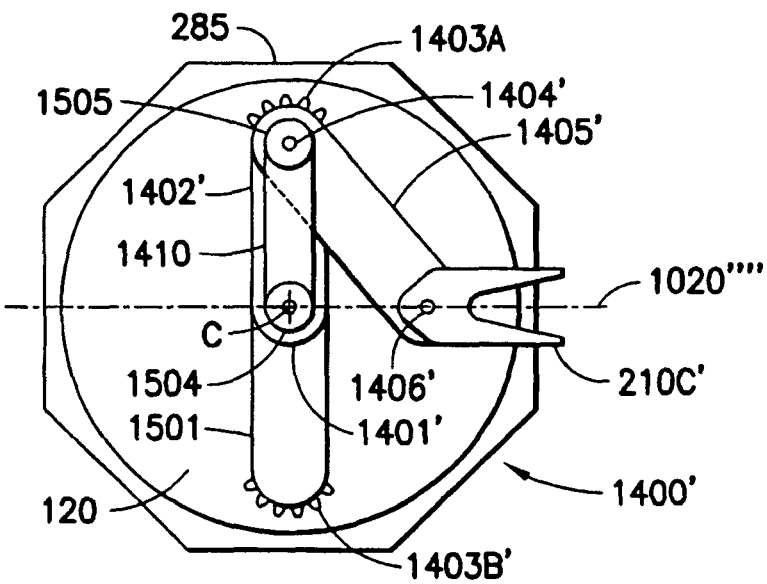
FIG. 15 shows a schematic top plan view of a substrate transport apparatus in accordance with still another exemplary embodiment.

Referring now to FIG. 15, another exemplary SCARA type transport 1400' is shown. This exemplary embodiment is substantially similar to the SCARA type transport 1400 however, magnets are not located on the forearm at the elbow as described above for transport 1400. Rather, the magnets 1403B' may be located on a distal end of a forearm drive member 1501. Forearm drive member 1501 may be rotatably mounted about the shoulder 1401', which in this example coincides with the center of the chamber 120, in substantially the same manner the upper arm 1402' is mounted. Upper arm 1402' may be mounted in substantially the same manner as upper arm 1402 described above. A shoulder pulley 1504 may also be mounted at the shoulder 1401' and may be fixedly connected to the forearm drive member 1501 so that when, for example, the forearm drive member 1501 is rotated the shoulder pulley 1504 rotates with it. An elbow pulley 1505 may be mounted at the elbow joint 1404' about the axis of rotation of the forearm 1405'. The elbow pulley 1505 may be fixedly mounted to the forearm 1405' so that when, for example, the elbow pulley 1505 rotates the forearm 1405' rotates with it. The elbow pulley 1505 may be drivingly connected to the shoulder pulley 1504 by, for example, a drive belt, band(s) or chain 1410. In alternate embodiments any suitable drive may be used. Shoulder pulley 1504, elbow pulley 1505 and belt 1410 may be contained within the upper arm 1402' and forearm 1405' so that any particles that may be generated are prevented from being released into the chamber 120. In alternate embodiments the shoulder pulley, elbow pulley and belt may be mounted in any suitable location. In other alternate embodiments, the forearm 1405' and or end effector 210C' may be slaved to the upper arm 1402' through the pulley system as described above.

The operation of the transport 1400' as shown in FIG. 15 is substantially the same as for transport 1400 except that the forearm 1405' is driven by the forearm drive member 1501 rather than magnets 1403B mounted on the forearm as described above for transport 1400. For example, when forearm drive member 1501 is caused to rotate by the eccentric magnetic leverage force and resulting torque produced by stator 1006', the shoulder pulley 1504 also rotates. Shoulder pulley 1504 in turn causes the elbow pulley 1505 to rotate. Shoulder pulley 1504 may be drivingly connected to the elbow pulley 1505 by, for example, belt 1410. The elbow pulley 1505 in turn causes the forearm 1405' to rotate. When the upper arm 1402' and the forearm drive member 1501 are actuated simultaneously, the end effector 210C' is caused to extend or retract along axis 1020'''' in a manner substantially similar to that described above with respect to transport 1400. It is noted that the end effector 210C' may have slaved movement such that as the end effector is extended it remains longitudinally oriented (e.g. front to back) along the axis of extension/retraction 1020''''.

Figure 17:
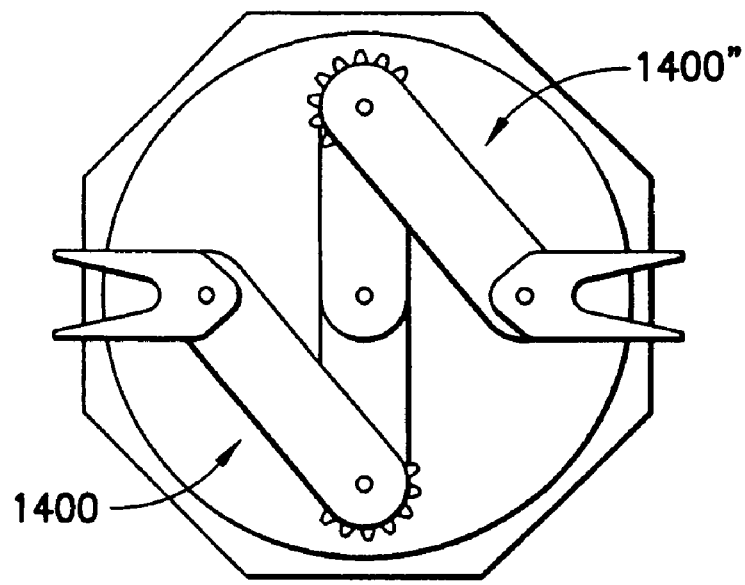
FIG. 17 shows a schematic top plan view of still another exemplary embodiment of a substrate transport apparatus.
Figure 18:
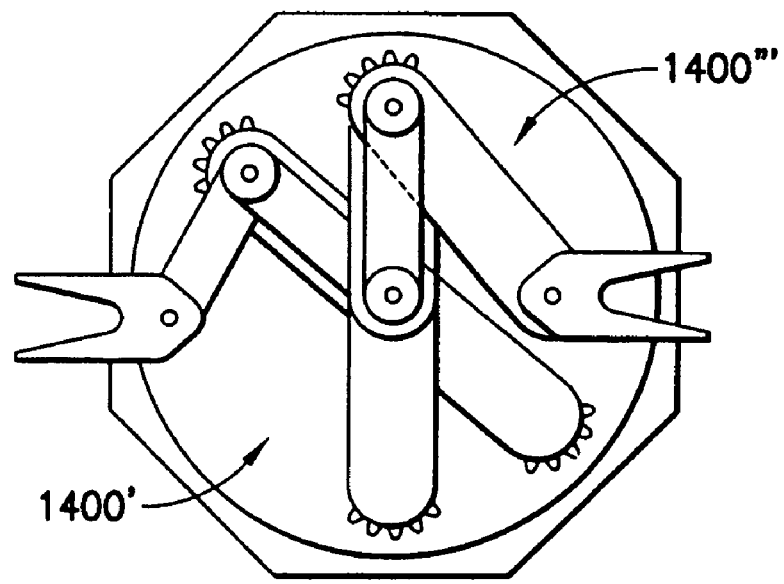
FIG. 18 shows a schematic top plan view of a transport apparatus in accordance with yet another exemplary embodiment.

In other exemplary embodiments, transport apparatus 1400, 1400' may have a second SCARA type transport 1400'', 1400''' rotatably mounted at the shoulder or center of the transfer chamber as can be seen in FIGS. 17 and 18. It is again noted the SCARA type transports shown in the Figures are merely an exemplary application of the drive system disclosed herein and that the drive system in not limited to any particular arm/transport configuration. Transports 1400'', 1400''' may be mounted within the transfer chamber in a manner substantially similar to that discussed for transport apparatus 1100 and shown in FIG. 12. Transports 1400'', 1400''' may operate in substantially the same manner as described above for transports 1400, 1400'. This would allow for a dual SCARA arm transport and fast swapping of substrate. The dual SCARA arms may be independently rotatable about the center of the chamber or they may rotate in unison in a manner substantially similar to that described above with respect to FIG. 11B.

Figure 20:
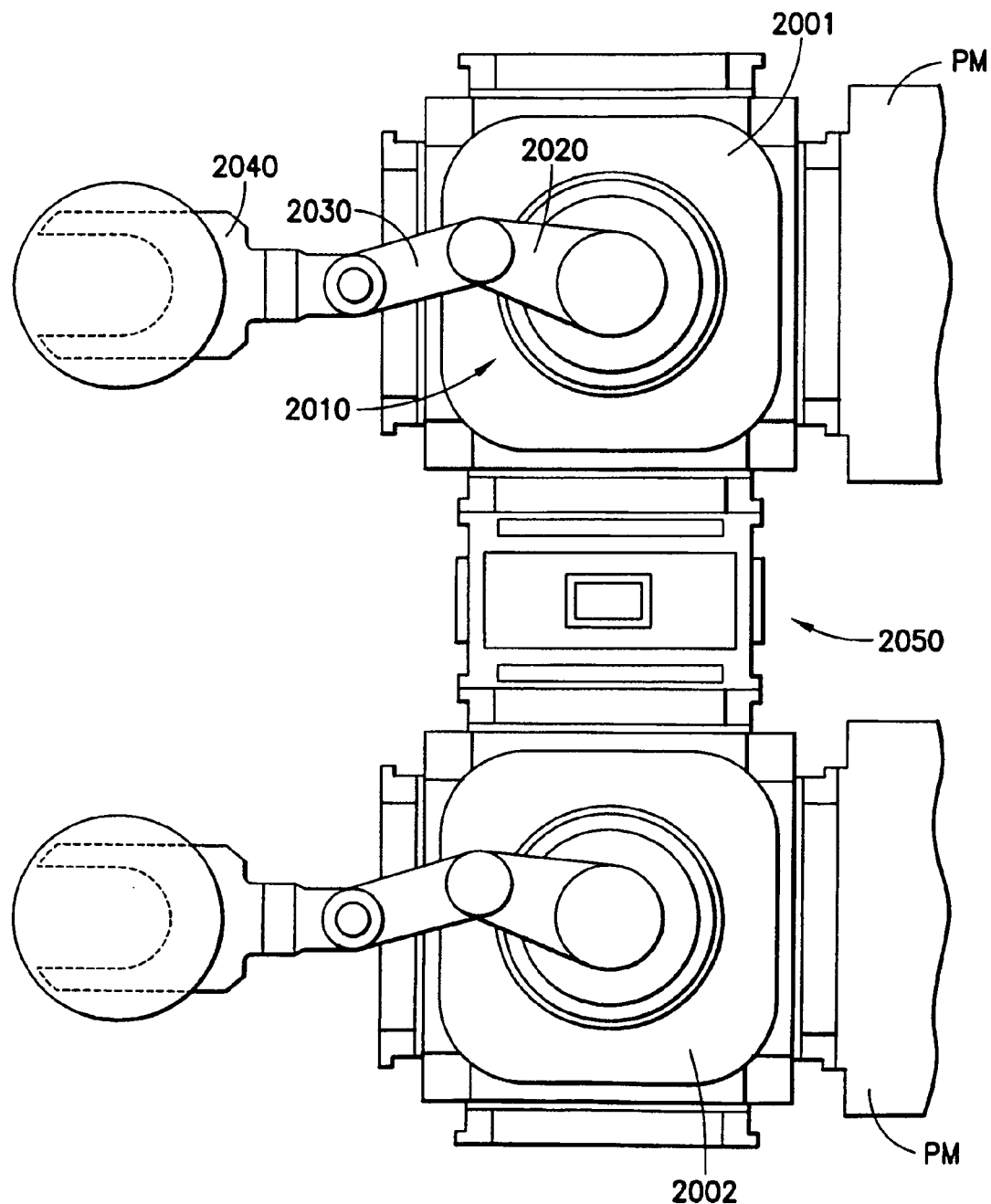
FIG. 20 illustrates an exemplary configuration of transfer chambers in accordance with an exemplary embodiment.

Referring now to FIG. 20, transfer chambers 2001, 2002 including the coaxial magnetic drive system described herein are shown as being coupled to each other as modular units. The transfer chambers may be coupled to each other in any suitable manner such as by a load lock or tunnel 2050. Each of the transfer chambers 2001, 2002 may be isolated from each other such that they each have their own internal atmosphere. In other exemplary embodiments the transfer chambers 2001, 2002 may not be isolated from each other. It is noted that while the transfer chambers described above have a generally circular shape it should be realized that the transfer chamber may have any suitable shape including, but not limited to, the rectangular shape shown in FIG. 20. In this exemplary embodiment the transfer assembly 2010 may be a slaved transfer system utilizing, for example belts and pulleys such that as the upper arm 2020 is rotated via respective rotors and stators the forearm 2030 and end effecter 2040 are extended into a processing module PM, another transfer chamber or any other suitable area. While the transfer assembly 2010 is shown as a SCARA type assembly it is noted that any suitable transfer assembly may be utilized such as, for example, the assemblies described above with respect to FIGS. 1-19. The rotors and stators of the transfer assembly 2010 may be suitably positioned within the transfer chambers 2001, 2002 such that a respective rotor (e.g. links 2020, 2030, 2040) are caused to be rotated for extension and retraction of the transfer assembly. For example, the stators may be located in the transfer chamber walls, within the transfer chamber or outside the transfer chamber as described above. In alternate embodiments the rotor and stators may be located within a base or housing of the transport assembly 2010 itself.

In addition to driving the various transports described in the exemplary embodiments above, in alternate embodiments, the transport drive motors may act as heating elements to bake out the chamber. In this alternate embodiment, the motor may have a controls mode for movement of the transports and a heat mode for baking out the chamber.

In still other alternate embodiments, hall sensors, for example sensors 299 as shown in FIG. 3A, may be located within the transport motors. The resolution of these hall sensors may be used as position feedback devices for the transports.

Each exemplary embodiment shown in the Figures is capable of the movements described above with respect to FIGS. 4A through 4E and 5A through 5C, regardless of the different rotors used in the various exemplary embodiments (e.g. circular rotor, spoke shaped rotor, etc.). Thus each exemplary embodiment may be capable of axially transporting a substrate to or from any location within the various components of substrate processing system 100 (FIG. 1), including transfer chamber 120, processing modules 110, or load locks 115. The present exemplary embodiments are advantageous in that no mechanical connections are required through the walls of transfer chamber 120.

It is important to note that any other linkage, arms, or end effector configuration suitable for positioning a substrate at a specific location may be used in the above exemplary embodiments.

In accordance with one exemplary embodiment a substrate transport apparatus is provided. The substrate transport apparatus includes a housing, a first stator linearly distributed substantially along peripheral walls of the housing, a second stator linearly distributed substantially along the peripheral walls of the housing, and a first substrate transport arm rotatable about a center of rotation located within the housing, the first substrate transport arm having an upper arm rotatable about the center of rotation and forming a first rotor, a second rotor rotatably coupled about the center of rotation, a forearm rotatably coupled at a first end to the upper arm at a location eccentric to the center of rotation and being drivingly coupled to the second rotor, and a first substrate support rotatably coupled to a second opposite end of the forearm, wherein the first stator and first rotor form a first motor and the second stator and second rotor form a second motor and the first stator and second stator are configured so that a motor output at a connection between the first and second motors and a respective one of the first and second rotors is a resultant force disposed peripheral to the upper arm.

In accordance with another exemplary embodiment a substrate transport apparatus is provided. The substrate transport apparatus including a frame, a first stator linearly distributed substantially about a periphery of the frame, a second stator linearly distributed substantially about the periphery of the frame, and a first substrate transport arm having, a first and second rotors rotatable about a center of rotation located within the frame, each of the first and second rotors having a distal end, a first and second arm links each being rotatably coupled at a first end to a respective distal end of the first and second rotors, and a first substrate support being rotatably coupled to a respective second end of the first and second arm links, wherein the first and second stators are configured to apply an resultant force to the first and second rotors where the resultant force is peripheral to the first and second arm links.

The embodiments described above are advantageous in that the controller and stators may be located outside the transfer chamber. It is noted that the environment outside the transfer chamber may contain a corrosive atmosphere, have an elevated temperature, or other generally hostile environment, resulting in less potential for contamination. The mechanical aspects of transporting substrates may also be simplified to include fewer arms, links, and components in general, resulting in less mass to move, better speed, precision, and control in substrate transport. All of these factors further contribute to improved substrate processing throughput.

It should be understood that the exemplary embodiments described herein may be used individually or in any suitable combination thereof. It should also be understood that the foregoing description is only illustrative of the invention. Various alternatives and modifications can be devised by those skilled in the art without departing from the invention. Accordingly, the present invention is intended to embrace all such alternatives, modifications and variances that fall within the scope of the appended claims.

What is claimed is:

1. A substrate transport apparatus comprising:
   a first shaftless rotary motor including a first stator and a first rotor, the first stator being linearly distributed and the first rotor being coupled to a first arm;
   a second shaftless rotary motor including a second stator and a second rotor, the second stator being linearly distributed and the second rotor being coupled to a second arm, the second arm being connected to the first arm; and
   a first substrate support being coupled to at least one of the first and second arms;
   wherein the first stator and second stator are configured so that the first and second arms and the first substrate support are inside the stators when the substrate transport apparatus is in a retracted configuration and a motor output at a connection between the first and second shaftless rotary motors and a respective one of the first and second arms is a resultant force disposed peripheral to the first and second arms.

2. The substrate transport apparatus of claim 1, further comprising a housing wherein the first and second stators are linearly distributed substantially about a periphery of the housing.

3. The substrate transport apparatus of claim 2, wherein the first and second stators are integrated into walls of the housing.

4. The substrate transport apparatus of claim 1, where each of the first and second arms comprises:
   a first rotatable arm link having a center of rotation and a distal end; and
   a second arm link rotatably coupled to the distal end of the first arm link;
   wherein, the first arm links of each of the first and second arms comprises a respective one of the first and second rotors and each of the second arm links of the first and second arms is rotatably coupled to the first substrate support.

5. The substrate transport apparatus of claim 1, wherein the first and second rotors are in the form of a ring or disk.

6. The substrate transport apparatus of claim 5, wherein the ring or disk of each of the first and second arms forms a self bearing motor with a respective one of the first and second stators.

7. The substrate transport apparatus of claim 4, wherein the first rotatable arm link of each of the first and second arms comprises a respective one of the first and second rotors in the form of an elongated link member where the distal end is opposite the center of rotation.

8. The substrate transport apparatus of claim 1, further comprising:
   a third shaftless rotary motor including a third stator and a third rotor, the third stator being linearly distributed and the third rotor being coupled to a third arm;
   a fourth shaftless rotary motor including a fourth stator and a fourth rotor, the fourth stator being linearly distributed and the fourth rotor being coupled to a fourth arm, the fourth arm being connected to the third arm; and
   a second substrate support being coupled to at least one of the third and fourth arms;
   wherein the third stator and fourth stator are configured so that the third and fourth arms and the second substrate support are inside the stators when the substrate transport apparatus is in the retracted configuration and a motor output at a connection between the third and fourth shaftless rotary motors and a respective one of the third and fourth arms is a resultant force disposed peripheral to the first and second arms.

9. The substrate transport apparatus of claim 8, further comprising a frame wherein the first, second, third and fourth stators are linearly distributed substantially about a periphery of the frame.

10. The substrate transport apparatus of claim 8, where the each of the first, second, third and fourth arms comprises:
    a first rotatable arm link having a center of rotation and a distal end; and
    a second arm link rotatably coupled to the distal end of the first arm link;
    wherein,
    the first arm links of each of the first second, third and fourth arms comprises a respective one of the first second, third and fourth rotors,
    each of the second arm links of the first and second arms is rotatably coupled to the first substrate support, and
    each of the second arm links of the third and fourth arms is rotatably coupled to the second substrate support.

11. The substrate transport apparatus of claim 8, wherein the first second, third and fourth rotors are in the form of a ring or disk.

12. The substrate transport apparatus of claim 11, wherein the ring or disk of each of the first second, third and fourth arms forms a self bearing motor with a respective one of the first second, third and fourth stators.

13. The substrate transport apparatus of claim 8, wherein the first rotatable arm link of each of the first second, third and fourth arms comprises a respective one of the first second, third and fourth rotors in the form of an elongated link member where the distal end is opposite the center of rotation.

14. The substrate transport apparatus of claim 8, wherein the first substrate support and the second substrate support extend and retract in substantially opposite directions.

15. The substrate transport apparatus of claim 8, wherein the first substrate support and the second substrate support extend and retract in substantially the same direction.

16. The substrate transport apparatus of claim 8, where each of the first, second third and fourth arms comprises:
    a first rotatable arm link having a center of rotation and a distal end; and
    a second arm link rotatably coupled to the distal end of the first arm link;
    wherein, the first arm links of each of the first, second, third and fourth arms comprises a respective one of the first, second third and fourth rotors, each of the second arm links of the first and second arms is rotatably coupled to the first substrate support and each of the second arm links of the third and fourth arms is rotatably coupled to the second substrate support.

17. The substrate transport apparatus of claim 1, wherein the first and second stators are configured to vertically move the first and second arms.

* * * * *